United States Patent
Matsue et al.

(10) Patent No.: US 10,663,598 B2
(45) Date of Patent: May 26, 2020

(54) ELECTRONIC DEVICE, DATE-AND-TIME ACQUISITION CONTROL METHOD, AND RECORDING MEDIUM

(71) Applicant: CASIO COMPUTER CO., LTD., Shibuya-ku, Tokyo (JP)

(72) Inventors: Takeshi Matsue, Kokubunji (JP); Tatsuya Sekitsuka, Kunitachi (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 91 days.

(21) Appl. No.: 15/988,580

(22) Filed: May 24, 2018

(65) Prior Publication Data
US 2018/0372880 A1 Dec. 27, 2018

(30) Foreign Application Priority Data

Jun. 21, 2017 (JP) ................................ 2017-121094

(51) Int. Cl.
G01S 19/23 (2010.01)
G04R 20/02 (2013.01)
(Continued)

(52) U.S. Cl.
CPC ............ G01S 19/235 (2013.01); G01S 1/026 (2013.01); G04R 20/02 (2013.01); G04R 20/04 (2013.01);
(Continued)

(58) Field of Classification Search
CPC ....... G01S 19/235; G01S 1/026; G04R 20/02; H03K 3/011
See application file for complete search history.

(56) References Cited

U.S. PATENT DOCUMENTS 7,010,307 B2 * 3/2006 Abraham .............. G01S 19/235
331/158
9,635,513 B2 4/2017 Oshita
(Continued)

FOREIGN PATENT DOCUMENTS

CN 105988363 A 10/2016
JP 61000771 1/1986
(Continued)

OTHER PUBLICATIONS

Japanese Office Action (and English language translation thereof) dated Mar. 12, 2019 issued in Japanese Application No. 2017-121094.
(Continued)

Primary Examiner — Jeffrey M Shin
(74) Attorney, Agent, or Firm — Holtz, Holtz & Volek PC

(57) ABSTRACT

Provided is an electronic device includes an oscillator circuit that outputs a clock signal of predetermined frequency, a clock circuit that counts date and time in accordance with input of the clock signal, a temperature sensor that measures a temperature relating to a change of the predetermined frequency, a receiver that receives a radio wave from a positioning satellite, and a first processor and/or a second processor. The first processor and/or the second processor estimates an amount of time count difference in date and time counted by the clock circuit on the basis of a history of temperatures measured by the temperature sensor, and combines date and time counted by the clock circuit, the estimated amount of time count difference, and part of date-and-time information obtained from a radio wave received by the receiver to identify current date and time.

17 Claims, 13 Drawing Sheets

(51) Int. Cl.
    *G04R 20/04*     (2013.01)
    *G01S 1/02*     (2010.01)
    *H03K 3/011*     (2006.01)
    *H03K 3/0231*     (2006.01)
    *H03K 3/03*     (2006.01)

(52) U.S. Cl.
    CPC .......... *H03K 3/011* (2013.01); *H03K 3/0231* (2013.01); *H03K 3/0307* (2013.01)

(56) References Cited

U.S. PATENT DOCUMENTS

| | | | |
|---|---|---|---|
| 10,031,488 B2 | 7/2018 | Oshita | |
| 2009/0112471 A1* | 4/2009 | Hayashi | G01S 19/23 |
| | | | 701/472 |
| 2011/0181366 A1* | 7/2011 | Schoepf | H03L 1/026 |
| | | | 331/18 |
| 2013/0234887 A1* | 9/2013 | Babitch | G01S 19/235 |
| | | | 342/357.65 |
| 2016/0277900 A1* | 9/2016 | Oshita | H04W 4/029 |

FOREIGN PATENT DOCUMENTS

| | | |
|---|---|---|
| JP | 2016121983 A | 7/2016 |
| JP | 2016176702 A | 10/2016 |
| JP | 2017009333 A | 1/2017 |

OTHER PUBLICATIONS

Extended European Search Report (EESR) dated Nov. 21, 2018 issued in European Application No. 18178379.6.
Chinese Office Action dated Feb. 6, 2020 (and English translation thereof) issued in Chinese Application No. 201810666159.5.

\* cited by examiner

ELECTRONIC DEVICE, DATE-AND-TIME ACQUISITION CONTROL METHOD, AND RECORDING MEDIUM

BACKGROUND

The present invention relates to an electronic device, a date-and-time acquisition control method, and a recording medium.

In conventional electronic clocks, there has been a technology for acquiring date-and-time information from outside to correct current date and time, accurately maintaining the current date and time. Date and time are mainly acquired using a standard electric wave (time code) in a long wavelength band or a navigation message from a positioning satellite. In addition, another technology is used to acquire date and time which is acquired from a mobile terminal such as a smartphone by positioning of the mobile terminal or synchronization of the mobile terminal with a cell phone base station via short-range wireless communication.

Power consumption required for receiving radio waves from a positioning satellite is considerably large compared with power consumption required for normally counting or displaying date and time.

For this reason, various technologies are proposed to reduce a time required for receiving radio waves from a positioning satellite to efficiently acquire date-and-time information. For example, in JP 2017-009333 A, a configuration is disclosed in which when a difference between date and time counted by an electronic clock and date and time in UTC is considered to be small, a code string (predicted code string) predicted to be received is generated beforehand to have a length (the number of codes) causing wrong identification of date and time with sufficiently low probability, and accurate date and time is acquired at appropriate time when the predicted code string is received. In addition, in JP 2017-009333 A, a technology is disclosed to reduce a time required for receiving radio waves from a positioning satellite and acquiring date and time using this configuration.

However, correcting date and time using counted date and time requires a difference in counted date and time to be within a predicted range, and otherwise, time and labor is required to acquire date and time or acquisition of date and time is made difficult.

SUMMARY

An electronic device, a date-and-time acquisition control method, and a recording medium is disclosed.

To achieve the objects described above, a preferable embodiment includes:

an oscillator that outputs a clock signal of predetermined frequency;

a clock circuit that counts date and time in accordance with input of the clock signal;

a temperature sensor that measures a temperature relating to a change of the predetermined frequency;

a positioning satellite radio receiver that receives a radio wave from a positioning satellite; and a processor.

The processor estimates an amount of time count difference in date and time counted by the clock circuit on the basis of a history of temperatures measured by the temperature sensor, combines date and time counted by the clock circuit, the estimated amount of time count difference, and part of date-and-time information obtained from a radio wave received by the positioning satellite radio receiver to identify current date and time, and corrects date and time counted by the clock circuit on the basis of the identified current date and time.

DETAILED DESCRIPTION

Hereinafter, embodiments will be described with reference to the drawings. It should be noted that the following embodiments describe an example of an electronic clock, but is not limited to the electronic clock if a device has a similar configuration. That is, the following embodiments can be applied to an electronic device having a similar configuration.

First Embodiment

Figure 1:
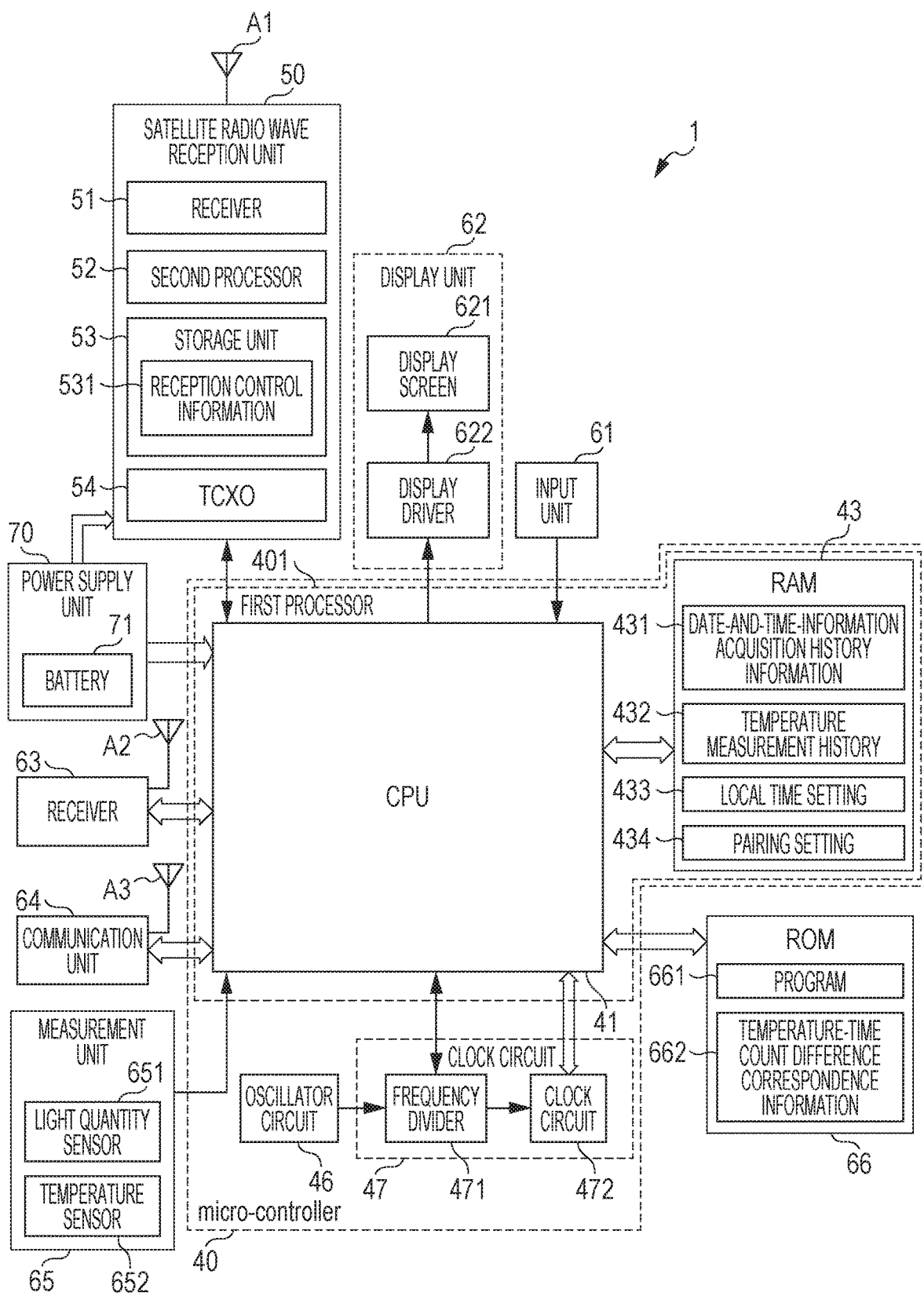
FIG. 1 is a block diagram illustrating a functional configuration of an electronic clock according to a first embodiment.

FIG. 1 is a block diagram illustrating a functional configuration of an electronic clock 1 according to a first embodiment.

The electronic clock 1 includes a micro-controller 40, a satellite radio wave reception unit 50 and an antenna A1, an input unit 61, a display unit 62, a receiver 63 and an antenna A2, a communication unit 64 and an antenna A3, a measurement unit 65, a read only memory (ROM) 66, a power supply unit 70, and the like.

The micro-controller 40 integrally controls the whole operation of the electronic clock 1. The micro-controller 40 includes a central processing unit (CPU) 41, a random access memory (RAM) 43, an oscillator circuit (oscillator) 46, a frequency divider 471, a clock circuit 472, and the like.

The CPU 41 performs various calculation for control operation. The control operation includes operations according to various functions of the electronic clock 1, in addition to various control operations, such as normal display of date and time, acquisition of current date-and-time information, and correction of date and time counted by the clock circuit 472. For example, the operations according to various functions of the electronic clock 1 includes an alarm notification function, a timer function, a stop watch function, and the like.

The RAM 43 provides a working memory space for the CPU 41 to store temporary data. The RAM 43 stores local time setting 433 including time zone settings or daylight saving time settings used to display and use current date and time (local time) in a region of the world in which a current position or the like is set. That is, the RAM 43 stores time difference information based on date and time according to universal time (UTC) and information relating to a position (city) which the time difference information indicates. The local time setting 433 includes information relating to the presence/absence of or the kind of a standard electric wave which can be received at the position (city).

The CPU 41 and the RAM 43 constitute a first processor 401.

Furthermore, the RAM 43 stores and holds date-and-time-information acquisition history information 431, a temperature measurement history 432, and pairing setting 434. The date-and-time-information acquisition history information 431 includes a source from which current date and time information is acquired from outside in the past and information about the acquired date and time. The date-and-time-information acquisition history information 431 stores at least the latest information about source from which current date and time is acquired and the acquired date and time, but the source and the information may be stored a plurality of times. Furthermore, the date-and-time-information acquisition history information 431 may include failed information acquisition.

The temperature measurement history 432 has history data of temperatures measured by a temperature sensor 652 for a predetermined period of time in the past or a predetermined number of temperatures measured by the temperature sensor 652. Alternatively, as the temperature measurement history 432, a history of amount of time count difference per time (unit amount of time count difference) in the clock circuit 472 may be stored. The amount of time count difference per time in the clock circuit 472 is obtained by converting temperature on the basis of temperature-time count difference correspondence information 662, which is described later. Here, temperature is periodically measured once every 10 minutes, the temperature or a unit amount of time count difference per 10 minutes which is obtained by converting the temperature is stored and held until read when a total amount of time count difference is calculated in a process of controlling reception of satellite radio waves, which is described later.

The pairing setting 434 holds identification information of an external device which can perform short-range wireless communication via the communication unit 64. In short-range wireless communication, on the basis of identification information held in the pairing setting 434, a request for communication connection is transmitted to an external device indicated by the identification information.

The oscillator circuit 46 generates and outputs a signal (clock signal) at a predetermined frequency, for example, 32.768 kHz. To generate the clock signal, for example, a crystal oscillator is used. The crystal oscillator may be externally mounted to the micro-controller 40. The frequency of the clock signal output from the oscillator circuit 46 changes in accordance with an external environment, mainly temperature.

The frequency divider 471 outputs frequency-divided signals obtained by dividing a clock signal input from the oscillator circuit 46 at a set dividing ratio. Setting of the dividing ratio may be changed by the CPU 41.

The clock circuit 472 counts signals of predetermined frequency (may be the same frequency as that of the clock signal) input from the frequency divider 471 to count and hold the present date and time. The accuracy of counting date and time by the clock circuit 472 depends on the accuracy of the clock signal from the oscillator circuit 46. That is, in date and time counted by the clock circuit 472, a difference from accurate date and time may change in accordance with a count time (i.e., the number of times of counting input signals) and ambient temperature. Current date and time is acquired by the satellite radio wave reception unit 50 or the communication unit 64 or is determined in accordance with a standard electric wave received by the receiver 63. The CPU 41 can correct the counted date and time on the basis of the current date and time.

The frequency divider 471 and the clock circuit 472 constitute a clock circuit 47 in the electronic clock 1 according to the present embodiment.

The satellite radio wave reception unit 50 receives and processes radio waves transmitted from a positioning satellite of a global navigation satellite system (GNSS), such as a global positioning system (GPS) of US, to perform reception operation, and acquires information about current date and time or a current position. Then, information required by the CPU 41 is output to the CPU 41 in a predetermined format. The satellite radio wave reception unit 50 includes a receiver 51, a second processor 52, a storage unit 53, a TCXO 54, and the like.

The receiver 51 receives and detects radio waves transmitted from a positioning satellite from which radio waves are to be received, identifies the positioning satellite and the phase of a transmitted signal for acquisition processing, tracks the radio waves transmitted from the positioning satellite on the basis of the acquired identification information and phase of the positioning satellite, and continuously demodulates and acquires transmitted signals (navigation messages).

The second processor 52 includes a CPU and the like, and performs variously controls the operation of the satellite radio wave reception unit 50. The second processor 52 causes the receiver 51 to receive a radio wave from the positioning satellite at appropriate time in accordance with an instruction from the micro-controller 40. Then, the second processor 52 performs processing according to a plurality of kinds of current date-and-time acquisition methods, which are described later to acquire necessary information, and identifies current date and time or calculates a current position (i.e., positioning).

The storage unit 53 stores reception control information 531, such as various setting data or received information, a program for control by the second processor 52 in the satellite radio wave reception unit 50, and the like. As the setting data, for example, format data of a navigation message of each positioning satellite, reference data for identifying a reception level, period setting data for week number (WN), which is described later, or the like. Furthermore, the received information includes, for example, acquired predicted orbit information (almanac) of each positioning satellite. Furthermore, the setting data includes a value (leap-second correction value) for correcting a difference in leap second between date and time transmitted from a positioning satellite of GPS (hereinafter, referred to as a GPS satellite) and the UTC date and time (Coordinated Universal Time). Here, the GPS satellite includes a complementary satellite of GPS, QZSS, or the like. The QZSS transmits a navigation message in a format substantially the same as that of the GPS at a transmission frequency the same as that of the GPS.

The TCXO 54 outputs a clock signal having a predetermined frequency for operation of each unit of the satellite radio wave reception unit 50. This frequency is determined in accordance with, for example, the frequency (1.023 MHz) of a C/A code for demodulating a radio wave from a positioning satellite (e.g., 16 MHz to 32 MHz). Furthermore, the TCXO 54 highly accurately outputs the clock signal at a stable frequency without influence of ambient temperature or the like.

The input unit 61 receives operation input from outside, such as user's operation. The input unit 61 includes a press button switch, a winder, and the like, and outputs an operation signal in accordance with pressing of the press button switch or drawing, rotation, or pressing of the winder to the CPU 41. Alternatively, the input unit 61 may include a touch sensor or the like.

The display unit 62 displays various information on the basis of control by the CPU 41 (micro-controller 40). The display unit 62 includes a display driver 622, a display screen 621, and the like. The display screen 621 uses, for example, a liquid crystal display screen (LCD) having segments, dot-matrix, or a combination thereof for digital display. Alternatively, the display unit 62 may have a configuration enabling display using, for example, a pointer and a stepping motor rotating the pointer, instead of the digital display using the display screen 621. The display driver 622 outputs a drive signal for causing the display screen 621 to perform display to the display screen 621, on the basis of a control signal from the CPU 41.

The receiver 63 receives and demodulates a standard electric wave transmitting a signal (time code) including current date-and-time information (including time information and date information) in a long wavelength band (low frequency band) via an antenna A2. The time code is transmitted every one minute containing coded date-and-time data for one minute cycle, and in the electronic clock 1, consistency of a plurality of (e.g., three) reception results (date and time obtained from received code strings) is checked to acquire accurate current date and time. Thus, good reception condition requires approximately three minutes to four minutes for one reception operation.

For the standard electric wave, JJY (registered trademark) of Japan, WWVB of US, MSF of UK, and DCF77 of Germany are widely used. A standard electric wave to be received is determined in accordance with the local time setting 433 described above or when a current position is in an area other than a reception area where any of the standard electric waves is received, the standard electric waves are not employed as an object to be received.

On the basis of control by the CPU 41, the communication unit 64 uses antenna A3 to perform various operations for short-range wireless communication, that is, Bluetooth (registered trademark) communication here, with an external electronic device (external device). The communication unit 64 performs control operation based on a determined communication standard to output communication data transmitted to the electronic clock 1 to the CPU 41 through demodulation and acquisition, and to output communication data as a communication radio wave to an external device of a communication party through modulation. The pairing setting 434 described above stores and holds identification information of the external device as the communication party, and the communication unit 64 normally transmits a request for communication connection to the external device indicated by the identification information. From the external device, current date-and-time information can be acquired. When communication is performed to acquire current date-and-time information, signals for a request for the current date-and-time information and a response to the request are transmitted and received between the external device and the electronic clock 1, in addition to transmission and reception of control signals for connection and disconnection of communication. Thus, in this case, a communication time is not more than one second, and a communication volume is also considerably small.

An external device as a target of short-range wireless communication is not particularly limited, but a mobile terminal, such as a smartphone or a cell phone, is mainly used. Holding identification information of the external device (pairing setting 434) beforehand establishes communication connection between the electronic clock 1 requiring communication connection and the external device operating within a communication range.

The measurement unit 65 includes a sensor that measures a physical amount, and outputs a detection signal according to a value of measurement by the sensor to the CPU 41. Here, the measurement unit 65 includes a light quantity sensor 651, the temperature sensor 652 (temperature sensor), and the like.

The light quantity sensor 651 is provided, for example, to be arranged in parallel with the display screen of the display unit 62 to measure a quantity of light emitted from outside. For the light quantity sensor 651, for example, a photodiode is used. The light quantity sensor 651 outputs an electric signal (voltage signal or a current signal) according to a quantity of incident light, and the electric signal is digitally sampled by an analog/digital converter (ADC), not illustrated, and input to the CPU 41.

Here, the temperature sensor 652 is disposed to measure a temperature in the vicinity of the oscillator circuit 46, that is, a temperature relating to the change of the frequency of a clock signal output from the oscillator circuit 46. For the temperature sensor 652, a small and light semiconductor sensor is preferably used. The temperature sensor 652 outputs an electric signal according to a measured temperature, and the electric signal is digitally sampled by an ADC, not illustrated, and output to the CPU 41. Note that the temperature sensor 652 may measure a temperature at a position, such as the CPU 41, which is heavily affected by another configuration of the micro-controller 40 or may measure a temperature near outside air, as long as the temperature can be converted to the temperature of the oscillator circuit 46.

The ROM 66 stores a program 661, initial setting data, and the like for the CPU 41 to perform control operation. The ROM 66 may include a non-volatile memory, such as a flash memory, in which data can be rewrite, in addition to or instead of a mask ROM. The program 661 includes a control program for acquiring current date and time. The initial setting data includes the temperature-time count difference correspondence information 662. The temperature-time count difference correspondence information 662 represents correspondence between a measured temperature T [° C.] and a unit amount D of time count difference [ppm]. The measured temperature T is measured by the temperature sensor 652, and the unit amount D of time count difference is caused in time counted by the clock circuit 472.

In the above description, the first processor 401 (the CPU 41 and the RAM 43) and/or the second processor 52 may function as a processor (computer) in the electronic clock 1 according to the present embodiment. Furthermore, the receiver 63 and the first processor 401 may constitute a date-and-time acquisition unit in the electronic clock 1 according to the present embodiment. Furthermore, the communication unit 64 may be included in the date-and-time acquisition unit.

Figure 2:
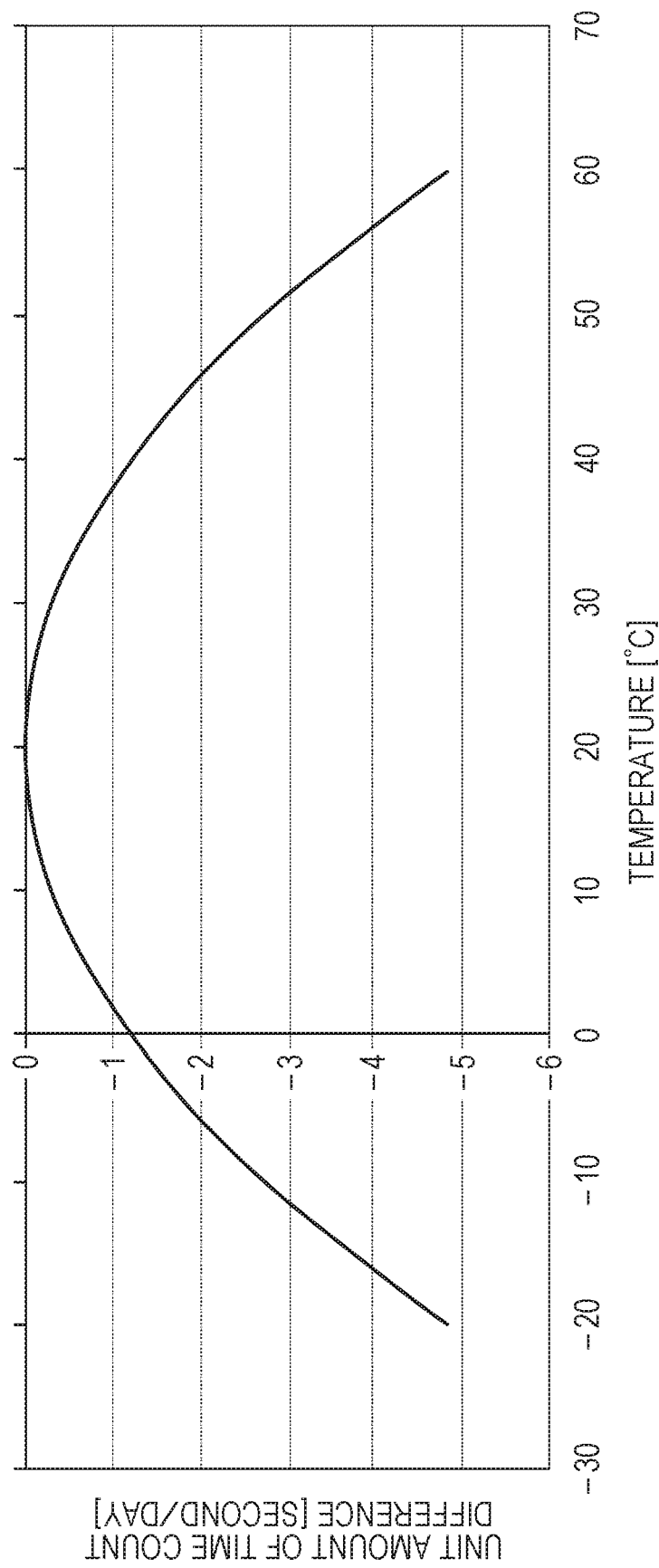
FIG. 2 is a graph illustrating exemplary correspondence between an amount of time count difference in counted date and time and measured temperature.

FIG. 2 is a graph illustrating exemplary correspondence between temperature T and an amount of time count difference in date and time. The temperature T is measured by the temperature sensor 652, and the amount of time count difference in date and time is counted by the clock circuit 472 in the electronic clock 1 according to the present embodiment. Here, the amount of time count difference represents the unit amount D of time count difference which is converted to a value [seconds/day] of time difference per day.

The unit amount D of time count difference in date and time at a reference temperature T0 (here, 20° C.) is defined as a reference unit amount D0 of time count difference ("0" in FIG. 2), and when the temperature T rises or drops relative to the reference temperature T0, the unit amount D of time count difference is shifted from the reference unit amount D0 of time count difference. When a crystal oscillator widely used for electronic clocks is used to count date and time, the unit amount D of time count difference is expressed as $D=D0+C\times(T-T0)^2$ with a predetermined coefficient C (e.g., $-0.035$ [ppm·° C.$^{-2}$]), depending on the square of the amount of time count difference from the reference temperature T0. In a normal use environment (+7° C. to +33° C.), the amount of time count difference per day is within a range of approximately 0.5 seconds with respect to the reference unit amount D0 of time count difference, but in an extreme environment (e.g., not more than −10° C. or not less than +50° C.), the amount of time count difference per day may be almost three seconds.

Here, in the temperature-time count difference correspondence information 662, the reference unit amount D0 of time count difference, the reference temperature T0, and the coefficient C are stored which are parameters as described above for calculating the unit amount D of time count difference according to the temperature T. In consideration of a normal use condition, the reference temperature T0 is preferably +20° C. to +25° C. Furthermore, the electronic clock which is fast is often considered to be preferable for practical use compared to the electronic clock which is slow. Thus, in a range of normal operating temperature, the unit amount D of time count difference is preferably "0" or a small positive value. In consideration of variation in the oscillator circuit 46 between products, in the electronic clock 1, for example, the reference temperature T0 is approximately 25±5° C., and the amount of time count difference per day corresponding to the reference unit amount D0 of time count difference is approximately 0.15±0.15 sec. That is, the unit amount D of time count difference is a positive value around the reference temperature T0, and is a negative value at temperatures far away from the reference temperature T0.

The reference temperature T0 and the reference unit amount D0 of time count difference may be examined and written before shipment. Alternatively, only fixed initial values (e.g., 25° C., 0.30 msec) or error ranges of the reference temperature T0 and the reference unit amount D0 of time count difference may be stored. Alternatively, offset values of the reference temperature T0 and the reference unit amount D0 of time count difference corresponding to the initial values measured in examination or on another occasion may be written.

Furthermore, the initial setting data stored in the ROM 66 includes the time difference information based on date and time according to UTC, such as time zone settings or daylight saving time settings in regions of the world, the information relating to a position (city) which the time difference information indicates, and the information relating to the presence/absence of or the kind of a standard electric wave which can be received at the position (city). Then, setting data for a position (city) corresponding to the current position is stored in the RAM 43 and used. The ROM 66 is externally mounted to the micro-controller 40, but may be integrally formed with the micro-controller 40.

The power supply unit 70 supplies power required to operate each unit of the electronic clock 1 to the corresponding unit. The power supply unit 70 supplies power output from a battery 71 at an operation voltage of each unit. When operation portions have different operation voltages, the power supply unit 70 uses a regulator to perform voltage conversion, outputting voltages. The power supply unit 70 may include, as the battery 71, a solar panel for generating power in accordance with incident light, a secondary battery for accumulating generated power, or the like. Furthermore, the power supply unit 70 may include a removable dry-cell battery or rechargeable battery operating as the battery 71.

Next, acquisition of the current date-and-time information by the electronic clock 1 according to the present embodiment will be described.

As described above, date and time counted by the clock circuit 472 (clock circuit 47) of the electronic clock 1 may have a difference with the current date and time. In contrast, the electronic clock 1 acquires identified correct current date and time, at appropriate time according to input of a correction command from outside periodically or by the user, and corrects date and time counted and held by the clock circuit 472. Thus, a difference in date and time which is counted and held by the clock circuit 472 is reduced.

In the electronic clock 1, the current date and time information is acquired from three kinds of current date and time obtained from the satellite radio wave reception unit 50, the current date-and-time information obtained from the standard electric wave received by the receiver 63, and current date-and-time information obtained from an external device via Bluetooth communication through the communication unit 64.

Date and time based on the standard electric wave received by the receiver 63 normally has sufficient accuracy (approximately 10 msec difference).

The current date-and-time information acquired from an external device through the communication unit 64 may include date and time counted by the external device and date and time acquired by a satellite radio wave reception unit of the external device. Furthermore, when an external device includes a cell phone function, current date-and-time information is acquired from a base station of cell phone communication. Furthermore, when an external device has an Internet connection function, current date-and-time information acquired from a time server or the like on the Internet may be indirectly acquired through the external device. Acquisition of the date and time counted by the external device may generate a difference as in the date and time counted by the clock circuit 472. In the following description, information about accuracy in date and time acquired from the external device is not obtained, but when information relating to accuracy in transmitted date and time is obtained from the external device, the transmitted date and time may be used.

Date and time obtained from the satellite radio wave reception unit 50 normally has sufficient accuracy (10 to 100 msec difference). However, when date and time is acquired on the basis of radio waves from a GPS satellite, another leap-second correction value is required. The GPS satellite transmits date and time without considering a leap second. Thus, the satellite radio wave reception unit 50 converts the radio waves from the GPS satellite into UTC date and time on the basis of the leap-second correction value representing a time difference with the UTC date and time in consideration of the leap second, and outputs the UTC date and time. The leap-second correction value may be acquired from the GPS satellite, but is desirably received at transmission timing of the GPS satellite or acquired from outside through the communication unit 64, since the leap-second correction value has a small frequency (once every 12.5 minutes).

The leap second can be added once every six months. When the leap second is added, a predetermined second (only one second at present) is inserted or deleted at appropriate time at which the leap second is added. Thus, when no information relating to the presence/absence of addition of the leap second or no information about a time difference after addition of the leap second is acquired before time of adding the leap second, date and time obtained from the satellite radio wave reception unit 50 may have a difference of one second, until the information about a time difference is acquire.

Note that since a standard electric wave from JJY or WWVB transmits information relating to the presence/absence of addition of the leap second for a predetermined period of time before appropriate time of adding the leap second, the time difference can be corrected at the time of adding the leap second on the basis of the information.

In the electronic clock 1 according to the present embodiment, a method for acquiring current date-and-time information from these three kinds of current date-and-time information is selected. Here, for example, acquisition of the current date-and-time information through the communication unit 64 is performed when pairing is set and communication connection is established to transmit and receive information other than date and time periodically at predetermined times (twice to four times) a day. Furthermore, in addition, in a reception area where a standard electric wave is received, the standard electric wave is received by the receiver 63 at predetermined time, once a day. Outside the reception area where a standard electric wave is received or in failure in reception of the standard electric wave in the reception area, date and time is acquired via reception of radio wave from a positioning satellite by the satellite radio wave reception unit 50 on the basis of predetermined input operation or the like by the user once a day at appropriate time when a predetermined condition is satisfied.

Next, acquisition of current date and time by the operation of the satellite radio wave reception unit 50 will be described in detail.

Figure 3:
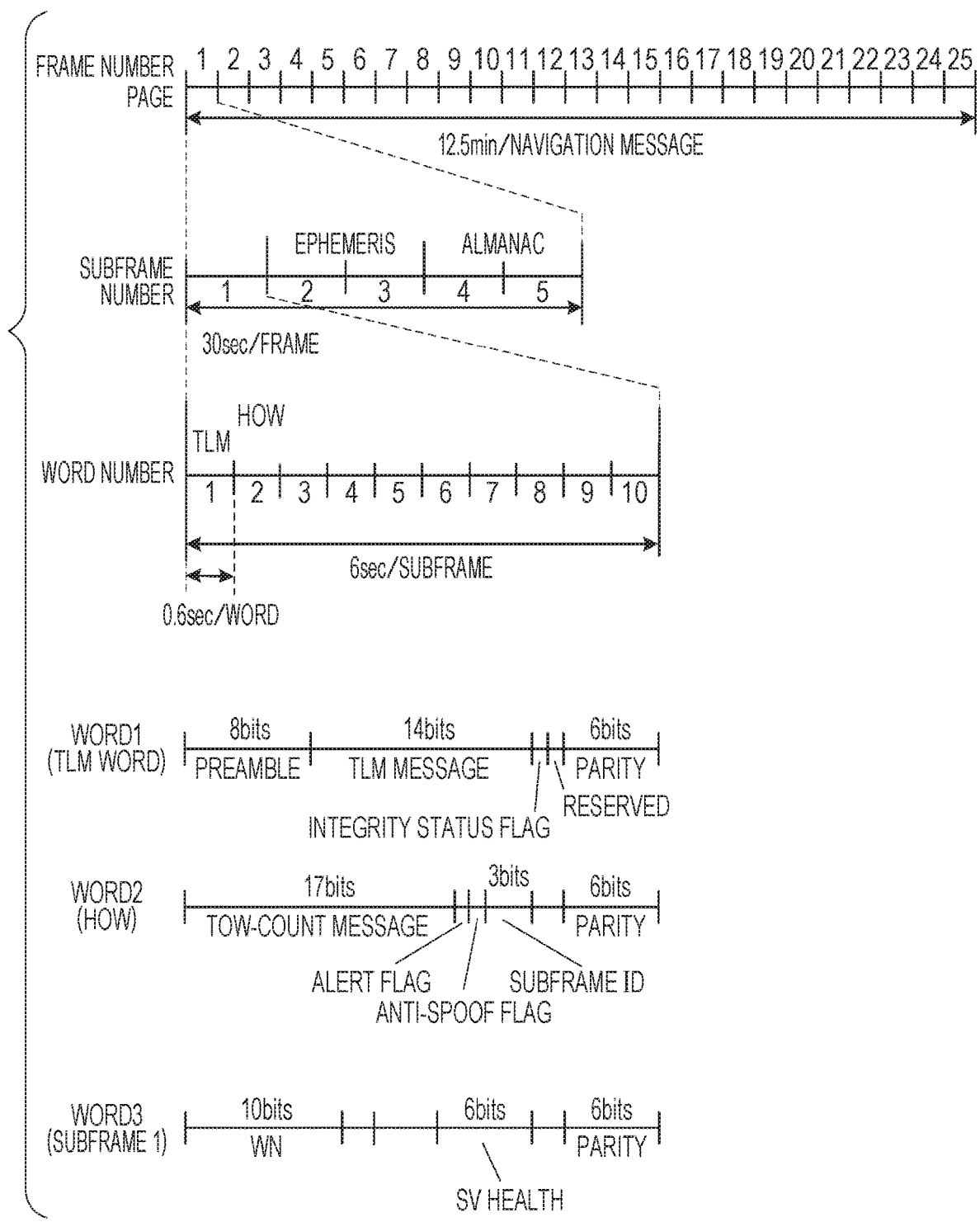
FIG. 3 is a diagram illustrating a format of a signal transmitted from a GPS satellite via radio waves.

FIG. 3 is a diagram illustrating a format of a signal (navigation message) transmitted from a GPS satellite via radio waves.

In a GPS, a total of 25 pages of 30 second frame data are transmitted from each GPS satellite, outputting all data every 12.5 minutes. The GPS uses a unique C/A code for each GPS satellite, and the C/A code is a 1,023 code sequence generated at a rate of 1.023 MHz and is repeated at 1 msec intervals. The code has a head synchronized with an internal clock of a corresponding GPS satellite, and when a shift in phase of the code is detected for each GPS satellite, phase shift (pseudorange) is detected in accordance with a distance from the GPS satellite to a current position.

Each frame data includes five subframes (six seconds each). Furthermore, each subframe includes 10 words (code blocks, 0.6 seconds each, WORD 1 to WORD 10 in order). Each word is 30 bits long (i.e., 30 binary codes).

WORD 1 and WORD 2 each have the same data format in all subframes. That is, the contents of WORD 1 and WORD 2 can be acquired from all subframes every six seconds. A telemetry word (TLM word) is transmitted in WORD 1. The telemetry word contains a 14-bit TLM message subsequent to a preamble which is a fixed 8-bit code string. Furthermore, in the telemetry word, following the TLM Message, a 1-bit integrity status flag, a 1-bit reserved bit, and a 6-bit parity code string (parity check code) are arranged in sequence. A handover word (HOW) is transmitted in WORD 2. In the HOW, following a 17-bit TOW-count (also referred to as Z-count) indicating an elapsed time within a week, a 1-bit alert flag and a 1-bit anti-spoof flag are arranged. Then, a subframe-ID indicating a subframe number is 3 bits, 2 bits are used for making the parity code string consistent, and parity code string is 6 bits.

The subframes have different data after WORD 3. WORD 3 of a subframe 1 contains a 10-bit week number (WN) at the head. Subframes 2 and 3 mainly contain the ephemeris (precise orbit information), and the almanac is transmitted in part of a subframe 4 and a subframe 5. That is, these information can be acquired once every 30 seconds in each frame. The leap-second correction value is contained only in subframe 4, page 18, and transmitted once every 12.5 minutes.

To decode the navigation message, the fixed code string (preamble) at the head of each subframe is normally required to be identified. Furthermore, the TOW-count in each subframe indicates date and time at which the head of a next subframe is transmitted.

Information required for the satellite radio wave reception unit 50 to obtain current date and time differs depending on a difference which may be contained in date and time counted by the clock circuit 472. When date and time counted by the clock circuit 472 has no considerable difference leading to a different date or week, the satellite radio wave reception unit 50 only acquires a TOW-count from any subframe (requiring approximately two to six seconds), and combines the TOW-count with the date and time counted by the clock circuit 472, obtaining accurate date and time (partial-reception-based time acquisition). Note that also in the partial-reception-based time acquisition, when the satellite radio wave reception unit 50 receives WORD 1 to WORD 3 in one subframe, WN contained in WORD 3 in subframe 1 may be received depending on reception time.

When date and time counted by the clock circuit 472 may have a considerable difference, the satellite radio wave reception unit 50 also receives WN in subframe 1. That is, in this condition, since the satellite radio wave reception unit 50 receives all data relating to date and time from the navigation message (approximately 3 to 30 seconds), date and time is obtained from information acquired from a GPS satellite without consideration of date and time counted by the clock circuit 472 (full-reception-based time acquisition). Note that the term "all data relating to date and time" here does not include correction information relating to the leap-second correction value.

Furthermore, when a difference in date and time calculated by the clock circuit 472 is fully small (not more than ±3 seconds), the satellite radio wave reception unit 50 can predict the contents of a navigation message received. That is, the satellite radio wave reception unit 50 can predict a fixed 8-bit code string (preamble) at the head of each subframe or a 17-bit TOW-count or a 3-bit subframe-ID of a HOW. Furthermore, 1-bit codes, such as the reserved bit, the integrity status flag, the alert flag, and the anti-spoof flag contained in the telemetry word and HOW, which are not set in a normal transmission state may be assumed to be reset. Thus, date and time indicated by a predicted code string is combined with time (part of date-and-time information; matching detection timing) at which a code string (received code string) matching the predicted code string is received, and predictive-reception-based time acquisition can be performed to identify and acquire present date and time. The predicted code string is generated on the basis of a code predicted on the basis of the counted date and time and an estimation amount of time count difference. The estimation amount of time count difference is described later. In the prediction-reception-based time acquisition, decoding of the received code string is not required again, and only determining matching/mismatching with the predicted code string is required. Note that since a navigation message transmitted from a positioning satellite may be inverted every word (30 bits), a reversed code string may be generated at the same time to determine matching/mismatching. Furthermore, a code string matching the predicted code string and a code string mismatching the predicted code string may be equivalently handled to detect the predicted code string.

When the satellite radio wave reception unit 50 is caused to acquire current date and time, the electronic clock 1 according to the present embodiment predicts (estimates) time to acquire the latest current date-and-time information. That is, on the basis of a temperature state (temperature measurement history 432) after time at which date and time is corrected, a difference (total amount τ of time count difference; amount of time count difference in date and time) which may be contained in date and time counted by the clock circuit 472 is predicted (estimated). Then, depending on whether the difference is within a reference range (not more than ±3 seconds as described above), any of the full-reception-based time acquisition, the partial-reception-based time acquisition (these two are collectively described as normal reception-based time acquisition), and the predictive-reception-based time acquisition is selected to acquire date and time.

This selection operation is performed by the CPU 41 (micro-controller 40). The CPU 41 (micro-controller 40) transmits and outputs necessary information, such as selection information and date and time counted by the clock circuit 472, to the satellite radio wave reception unit 50, together with a date-and-time acquisition command, and causes the satellite radio wave reception unit 50 to acquire current date and time.

A difference may be calculated, for example, by approximating a temperature change in a predetermined measurement interval Δt (between adjacent measured date and time t1 and t2) by a primary line (linear change) using measured temperatures T1 and T2 taken twice during the measurement interval Δt, and by integrating a unit amount D of time count difference in the measurement interval Δt. That is, here, Δτ=∫Ddt (t=t1 to t2) is given to determine an amount Δτ of time count difference during the measurement interval Δt, using a coefficient C, a reference unit amount D0 of time count difference and reference temperature T0, which are constants, the two measured temperatures T1 and T2, and the measurement interval Δt. Then, the amounts Δτ of time count difference during the measurement intervals after the last date and time correction timing are added, and a total τ (=ΣΔτ) can be obtained. This total amount of difference τ is obtained by adding a constant increase portion and a variation portion. The constant increase portion can be obtained by multiplying the reference unit amount D0 of time count difference and an elapsed time ΣΔt totalized from the last date-and-time correction. The variation portion varies in accordance with an absolute value |T−T0| of a temperature difference relative to the reference temperature T0.

Figure 4:
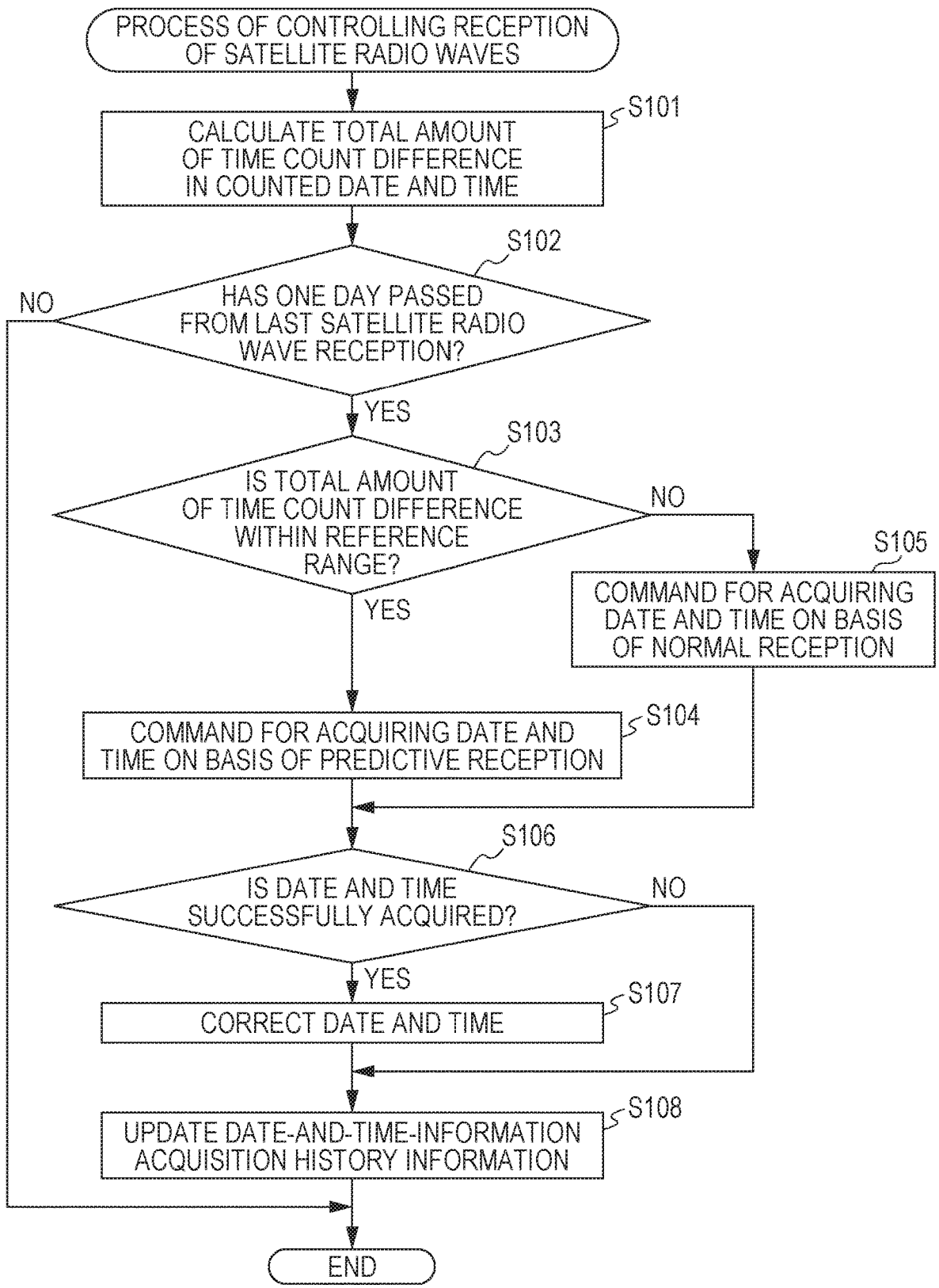
FIG. 4 is a flowchart illustrating a control procedure for a process of controlling reception of satellite radio waves performed in the electronic clock according to the first embodiment.

FIG. 4 is a flowchart illustrating a control procedure of the CPU 41 for the process of controlling reception of satellite radio waves performed in the electronic clock 1 according to the first embodiment.

The process of controlling reception of satellite radio waves is activated when a condition for acquiring date-and-time information on the basis of satellite radio wave reception is satisfied or when a command is acquired from the user.

When the process of controlling reception of satellite radio waves is started, the CPU 41 calculates the total amount τ of time count difference from the last date and time correction timing (step S101; difference calculation step, difference calculation means). The CPU 41 determines whether one or more days have passed from the last satellite radio wave reception (step S102). A frequency of radio wave reception is set to not more than once a day (second frequency) here, due to limited supply capacity of the power supply unit 70. When determining that one or more days have not passed ("NO" in step S102), the CPU 41 finishes the process of controlling reception of satellite radio waves.

When determining that one or more days have passed ("YES" in step S102), the CPU 41 determines whether the calculated total amount τ of time count difference is within a reference range (here, less than ±3.0 seconds; within the reference range) (step S103). When determining that the calculated total amount τ of time count difference is within the reference range ("YES" in step S103), the CPU 41 selects the predictive-reception-based time acquisition and outputs a command for causing the satellite radio wave reception unit 50 to acquire date-and-time information together with date-and-time information counted by the clock circuit 472 (step S104). At this time, in a case where a predicted code string is generated by the CPU 41, the CPU 41 generates the predicted code string and outputs the predicted code string to the satellite radio wave reception unit 50. Then, the CPU 41 proceeds to step S106.

When determining that the calculated total amount τ of time count difference is outside the reference range ("NO" in step S103), the CPU 41 selects the normal reception-based time acquisition and outputs a command for causing the satellite radio wave reception unit 50 to acquire date-and-time information (step S105). Then, the CPU 41 proceeds to step S106.

In step S106, the CPU 41 acquires a result of acquisition of the date-and-time information from the satellite radio wave reception unit 50 (date-and-time identification step, date and time identification means), and determines whether the date-and-time information is successfully acquired (step S106). When determining that the date-and-time information is successfully acquired ("YES" in step S106), the CPU 41 corrects the date and time of the clock circuit 472 (step S107; correction step, correction means). Then, the CPU 41 proceeds to step S108. When determining that the date-and-time information is not successfully acquired (fail) ("NO" in step S106), the CPU 41 proceeds to step S108.

In step S108, the CPU 41 updates the date-and-time-information acquisition history information 431 (step S108). Then, the CPU 41 finishes the process of controlling reception of satellite radio waves.

As described above, the electronic clock 1 according to the first embodiment includes the oscillator circuit 46 that outputs a clock signal of predetermined frequency, the clock circuit 47 that counts date and time in accordance with input of a clock signal, the temperature sensor 652 that measures a temperature relating to the change of the predetermined frequency, the receiver 51 that receives a radio wave from a positioning satellite, and a processor including the first processor 401 and the second processor 52. The processor estimates a total amount τ of time count difference in date and time counted by the frequency divider 471 and the clock circuit 472, on the basis of a history (temperature measurement history 432) of temperatures measured by the temperature sensor 652, and combines date and time counted by the clock circuit 47, the estimated total amount τ of time count difference, and part of date-and-time information obtained from radio waves received by the receiver 51 to identify current date and time.

As described above, temperature is measured appropriately to estimate the total amount τ of time count difference on the basis of the history of temperatures, enabling more accurate estimation of a difference in counted date and time than conventional one. Thus, when acquiring date and time by receiving satellite radio wave, the amount of necessary date-and-time information, generation or non-generation of a predicted code string, or the like can be appropriately determined. Accordingly, necessary time period for reception or content to be received is appropriately determined, reducing an unnecessary time period for reception. Thus, the electronic clock 1 can acquire date and time more accurately and efficiently. The date and time acquired in this way enables correction of the date and time counted by the clock circuit 47 (clock circuit 472), and the electronic clock 1 can maintain efficient and appropriate count and display of date and time with less difference and high accuracy.

Furthermore, the processor performs the predictive-reception-based time acquisition. In the predictive-reception-based time acquisition, the processor generates a predicted code string expected to be received by the receiver 51, on the basis of date and time and a total amount τ of time count difference which are counted and estimated, respectively, by the frequency divider 471 and the clock circuit 47, and then the processor identifies current date and time on the basis of matching detection timing between the predicted code string and a received code string received by the receiver 51.

The predictive-reception-based time acquisition only requires detection of matching between a code string and a predicted code string without requiring further decoding of the code string to identify date and time. The predicted code string needs to be generated within a range of date-and-time information contained in the predicted code string. In the electronic clock 1, accurate estimation of the total amount τ of time count difference can prevent the generation of situations, such as difficulty in identification of date and time because of no reception of date and time of a predicted code string due to an unexpected difference in counted date and time, and time and labor required to generate a predicted code string again. Thus, the electronic clock 1 can acquire date and time more accurately and efficiently. Note that, here, the matching detection timing is not limited to time at which a code string completely matching a predicted code string is detected, and may include time at which a received code string which may be determined to match a predicted code string with a probabilistically sufficient degree of accuracy is received.

Furthermore, when the total amount τ of time count difference is outside a predetermined reference range (±3 seconds), the processor decodes a received code string to acquire current date and time. That is, when there is no probability of receiving date and time of a predicted code string, the TOW-count or the like is decoded without performing the predictive-reception-based time acquisition form the beginning. Thus, reception of no predicted code string can be prevented from the beginning, acquiring date-and-time information accurately and efficiently.

Furthermore, a date-and-time acquisition control method according to the present embodiment includes a difference calculation step of estimating a total amount τ of time count difference in date and time counted by the frequency divider 471 and the clock circuit 47 on the basis of a history (temperature measurement history 432) of temperatures measured by the temperature sensor 652, and a date-and-time identification step of combining date and time counted by the clock circuit 47, the estimated total amount τ of time count difference, and part of date-and-time information obtained from radio waves received by the receiver 51 to identify current date and time.

Use of such a date-and-time acquisition control method enables more accurate and efficient acquisition of date-and-time information with an appropriate reception amount and time without requiring unnecessary labor and time for reception, when receiving a radio wave transmitted from a positioning satellite and acquiring date and time.

Furthermore, the program 661 relating to reception control for performing the process described above is installed to select a date-and-time acquisition method appropriate in terms of software on the basis of a total amount τ of time count difference, facilitating more accurate and efficient acquisition of date-and-time information.

Second Embodiment

Next, an electronic clock according to a second embodiment will be described.

Figure 5:
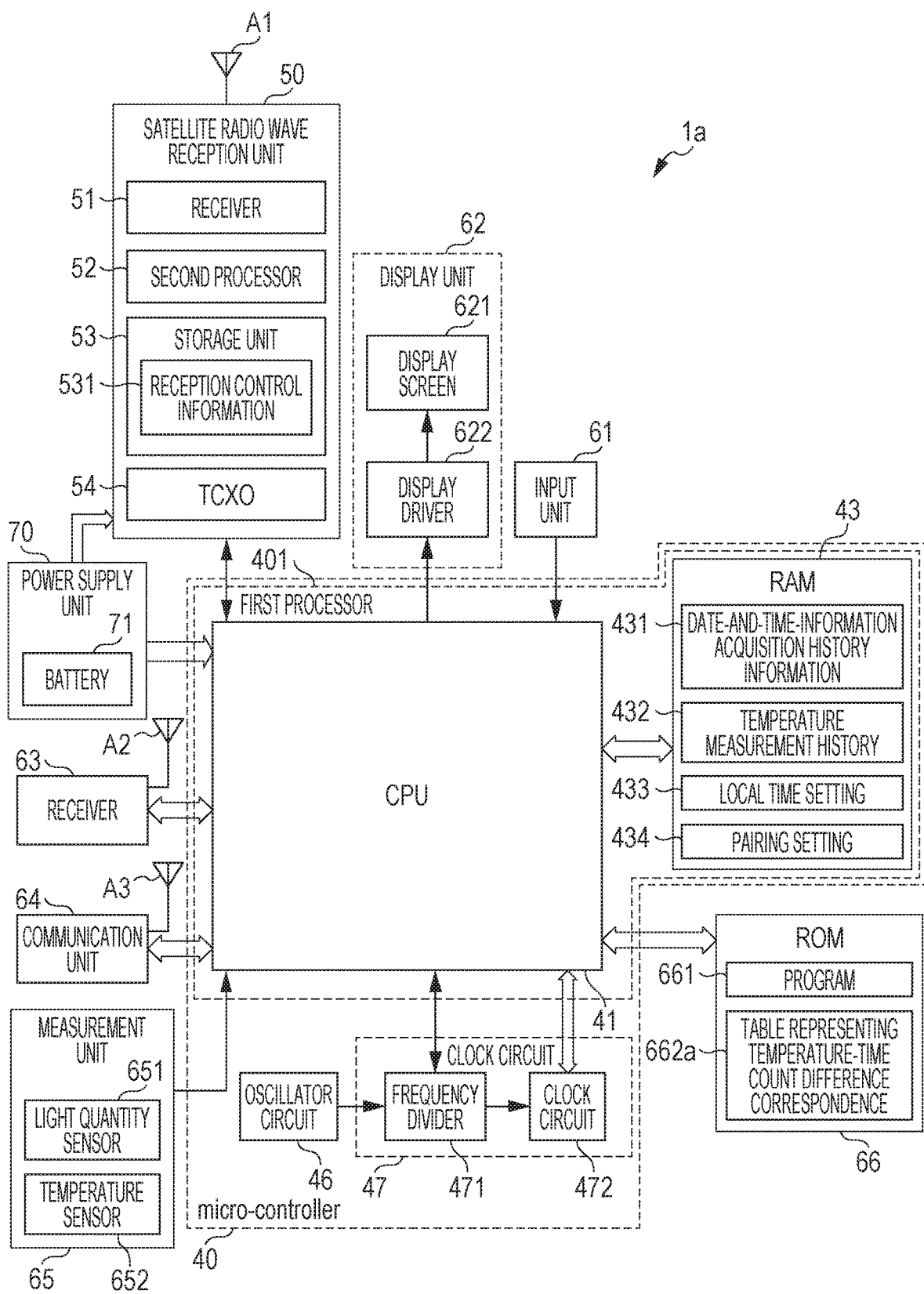
FIG. 5 is a block diagram illustrating a functional configuration of an electronic clock according to a second embodiment.

FIG. 5 is a block diagram illustrating a functional configuration of an electronic clock 1a according to the present embodiment.

The electronic clock 1a according to the second embodiment has the same configurations as those of the electronic clock 1 according to the first embodiment, excluding that the ROM 66 stores a table 662a representing temperature-time count difference correspondence instead of the temperature-time count difference correspondence information 662. Furthermore, the same configurations are denoted by the same reference signs and detailed description thereof will be omitted.

The table 662a representing temperature-time count difference correspondence stores arrangement of correspondence of temperatures T to unit amounts D of time count difference at predetermined temperature intervals. In this configuration, the temperature interval is appropriately determined, but the unit amounts D of time count difference are desirably stored and arranged on both sides (higher temperature side and lower temperature side) of the reference temperature T0 described above, at predetermined temperature intervals.

Next, date-and-time correction operation based on satellite radio wave reception in the electronic clock 1a according to the present embodiment will be described. In the electronic clock 1a according to the present embodiment, counted date and time counted by the clock circuit 47 (clock circuit 472) is corrected on the basis of a total amount τ of time count difference determined for the counted date and time, and when date-and-time information is acquired on the basis of satellite radio wave reception, a predicted code string is generated on the basis of the corrected date and time to perform predictive-reception-based time acquisition.

Furthermore, in the embodiments described above, the temperature T linearly changes (i.e., secondary change of the unit amount D of time count difference) during the measurement interval Δt of temperature measurement. However, here, the amount Δτ of time count difference and the total amount τ of time count difference are calculated on the assumption that the temperature T during the measurement interval Δt is held constant (unit amount D of time count difference is also held constant). That is, the amount Δτ of time count difference is given by Δτ=D(T)×Δt.

A temperature-dependent unit amount D(T) of time count difference is acquired in accordance with temperature T, with reference to the table 662a representing temperature-time count difference correspondence. When the unit amount D(T) of time count difference corresponding to the temperature T is not stored, linear interpolation is performed on unit amounts D(TU) and D(TL) of time count difference, and the unit amount D(T) of time count difference is determined. The unit amounts D(TU) and D(TL) of time count difference correspond to temperatures TU and TL which are higher than and lower than the temperature T, respectively, and have the unit amount D of time count difference stored. Note that parameters (coefficient C, reference temperature T0, and reference unit amount D0 of time count difference) for determining the unit amount D(T) of time count difference may be stored, as described above, to calculate the unit amount D(T) of time count difference at temperature T. Then, when the unit amounts D(T) of time count difference at temperature T can be added to determine the total amount τ of time count difference from the last date-and-time correction.

In this case, the product of the unit amounts D(T) of time count difference and the product of the measurement intervals Δt may be calculated before addition, or otherwise, the unit amounts D(T) of time count difference may be added so that the obtained total value is multiplied by the measurement interval Δt.

Figure 6:
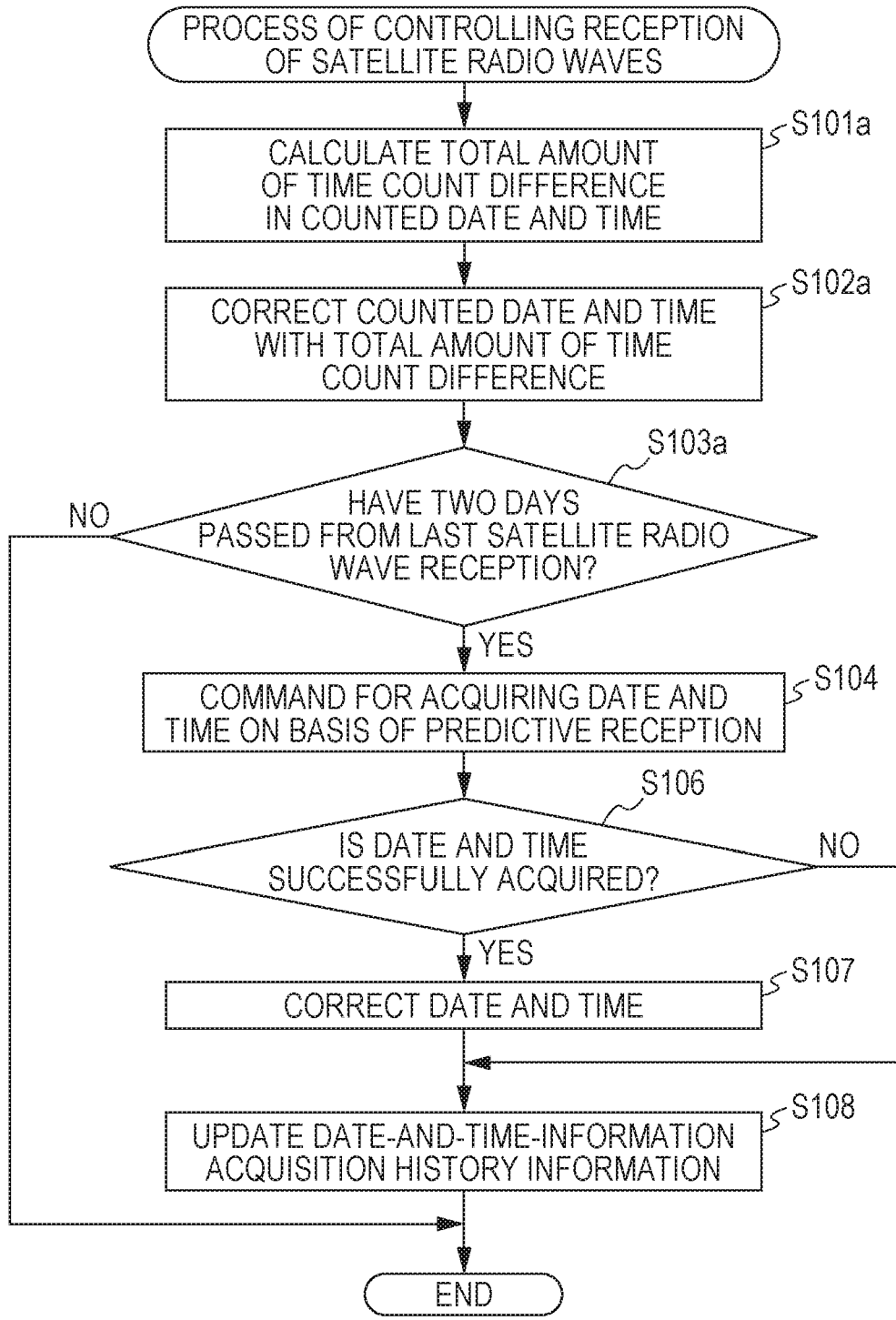
FIG. 6 is a flowchart illustrating a control procedure of a process of controlling reception of satellite radio waves performed in the electronic clock according to the second embodiment.

FIG. 6 is a flowchart illustrating a control procedure of the CPU 41 for a process of controlling reception of satellite radio waves performed in the electronic clock 1a according to the second embodiment. In this process of controlling reception of satellite radio waves, steps S101 to S103 in the process of controlling reception of satellite radio waves performed in the electronic clock 1 according to the first embodiment are replaced with steps S101a to S103a, respectively. Furthermore, step S105 is omitted. The other is the same as the process of controlling reception of satellite radio waves performed in the electronic clock 1 according to the first embodiment, and the contents of the same processing are denoted by the same reference signs and description thereof will be omitted.

The process of controlling reception of satellite radio waves may be activated at a predetermined frequency, for example, once to several times a day, in addition to when receiving a command for acquiring date and time on the basis of satellite radio wave reception.

When the process of controlling reception of satellite radio waves is started, the CPU 41 calculates the total amount τ of time count difference, as described above (step S101a). The CPU 41 corrects date and time counted and held by the clock circuit 472 with the total amount τ of time count difference (step S102a). The CPU 41 erases or distinguishably classifies data of the temperature measurement history 432 used for calculation of the total amount τ of time count difference.

The CPU 41 determines whether two or more days have passed from the last satellite radio wave reception (step S103a). When determining that two or more days have not passed ("NO" in step S103a), the CPU 41 finishes the process of controlling reception of satellite radio waves.

When determining that two or more days have passed ("YES" in step S103a), the CPU 41 outputs a command for acquiring date and time on the basis of predictive reception together with the corrected date-and-time information to the satellite radio wave reception unit 50, (step S104). Then, the CPU 41 proceeds to step S106.

Note that step S102a may be performed only before satellite radio wave reception. In this case, the CPU 41 may correct the date and time counted by the clock circuit 472 or may temporarily separately hold the date and time counted by the clock circuit 472 as date and time output to the satellite radio wave reception unit 50. Furthermore, when the date and time counted and held by the clock circuit 472 is not corrected with the total amount τ of time count difference, an interval for acquiring date and time on the basis of predictive reception may be set to one or more days as in the first embodiment, without increasing the interval to two or more days (without reducing the frequency of radio wave reception to not more than once every two days (first frequency) which is smaller than the second frequency).

As described above, in the electronic clock 1a according to the second embodiment, the processor (the first processor 401 and the second processor 52) corrects date and time counted by the clock circuit 47 (clock circuit 472) on the basis of an estimated total amount τ of time count difference, and generates a predicted code string in accordance with the corrected date and time. As described above, since counted date and time is corrected beforehand on the basis of a total amount τ of time count difference, a difference in counted date and time can be reduced as a whole without correcting date and time on the basis of satellite radio wave reception. Furthermore, since a predicted code string is generated on the basis of the corrected date and time, radio waves can be received from a positioning satellite with usual reception setting without complicating control of a radio wave reception period or the like to detect a received code string matching a predicted code string. Thus, the electronic clock 1a can acquire date and time more accurately and efficiently.

Furthermore, when correcting date and time counted by the clock circuit 47 (clock circuit 472) on the basis of a total amount τ of time count difference, the processor sets the frequency of radio wave reception by the receiver 51 to not more than once every two days. That is, when the date and time counted by the clock circuit 472 can be maintained more accurately by correction with the total amount τ of time count difference, considerable reduction in count and display accuracy of date and time is prevented without frequently acquiring date and time by receiving satellite radio waves. Therefore, an upper limit can be set on the frequency of date and time acquisition using satellite radio waves, reducing power consumption due to satellite radio wave reception without reducing the accuracy of the electronic clock 1*a*.

Furthermore, the processor sets the frequency of radio wave reception by the receiver 51 to not more than once a day as previously determined, and when correcting counted date and time on the basis of the total amount τ of time count difference described above, the processor further reduces the frequency of radio wave reception.

That is, power consumption can be reduced as much as the number of times of receiving radio waves is reduced, without reducing the accuracy of counting date and time by the electronic clock 1*a*.

Third Embodiment

Next, an electronic clock according to a third embodiment will be described.

An electronic clock 1 according to the present embodiment has the same configurations as those of the electronic clock 1 according to the first embodiment, and the same configurations are denoted by the same reference signs and description thereof will be omitted.

In the electronic clock 1 according to the present embodiment, the reference unit amount D0 of time count difference and the reference temperature T0 as the initial values are held in the temperature-time count difference correspondence information 662, together with respective error range information, and have unknown precise values within error ranges indicated by the error range information (±ΔD for the reference unit amount of time count difference, and ±ΔT for the reference temperature). These errors are mainly caused by manufacturing variation or the like between products, as described above.

In the electronic clock 1, when calculating an amount Δτ of time count difference or a total amount τ of time count difference, an estimated error is determined in accordance with an error range (±ΔD, ±ΔT) of an initial value. A maximum value (the electronic clock is fast) of the amount Δτ of time count difference (total amount τ of time count difference) can be obtained by merely multiplying a maximum value (D0+ΔD) within the error range of the reference unit amount D0 of time count difference by a measurement interval Δt. Alternatively, more precisely, when measured temperatures T are within the error range (T0±ΔT) of the reference temperature T0, the maximum values (D0+ΔD) within the error range may be added. Furthermore, in a case where T>T0+ΔT, when the temperature T−ΔT corresponds to the reference temperature T0, a sum of the unit amount D of time count difference and the maximum error value ΔD (or when temperature T corresponds to reference temperature T0+ΔT, a sum of the unit amount D of time count difference and the maximum error value ΔD) may be added. Furthermore, in a case where T<T0−ΔT, when the temperature T+ΔT corresponds to the reference temperature T0, a sum of the unit amount D of time count difference and the maximum error value ΔD (or when temperature T corresponds to reference temperature T0−ΔT, a sum of the unit amount D of time count difference and the maximum error value ΔD) may be added.

In a case where temperature T is higher than the reference temperature T0, a minimum value (the electronic clock is slow) of the amount Δτ of time count difference (total amount τ of time count difference) can be obtained by adding the unit amount D of time count difference to a minimum error value (−ΔD) when temperature T+ΔT corresponds to the reference temperature T0 (or by adding the unit amount D of time count difference to a minimum error value (−ΔD) when temperature T corresponds to the reference temperature T0−ΔT). In a case where temperature T is lower than the reference temperature T0, the unit amount D of time count difference is added to the minimum error value (−ΔD) when temperature T−ΔT corresponds to the reference temperature T0 (or the unit amount D of time count difference is added to the minimum error value (−ΔD) when temperature T corresponds to the reference temperature T0+ΔT). In this way, addition can be performed.

Accordingly, since the maximum value and the minimum value of the total amount τ of time count difference are calculated, generation of a predicted code string only within the margin of estimated error from the maximum value to the minimum value and detection of matching to the predicted code string are only required, when causing the satellite radio wave reception unit 50 to perform predictive-reception-based time acquisition. Thus, a processing rate may be reduced and the number of positioning satellites to be tracked may be increased by the same amount to perform other processing such as parallel reception.

Figure 7:
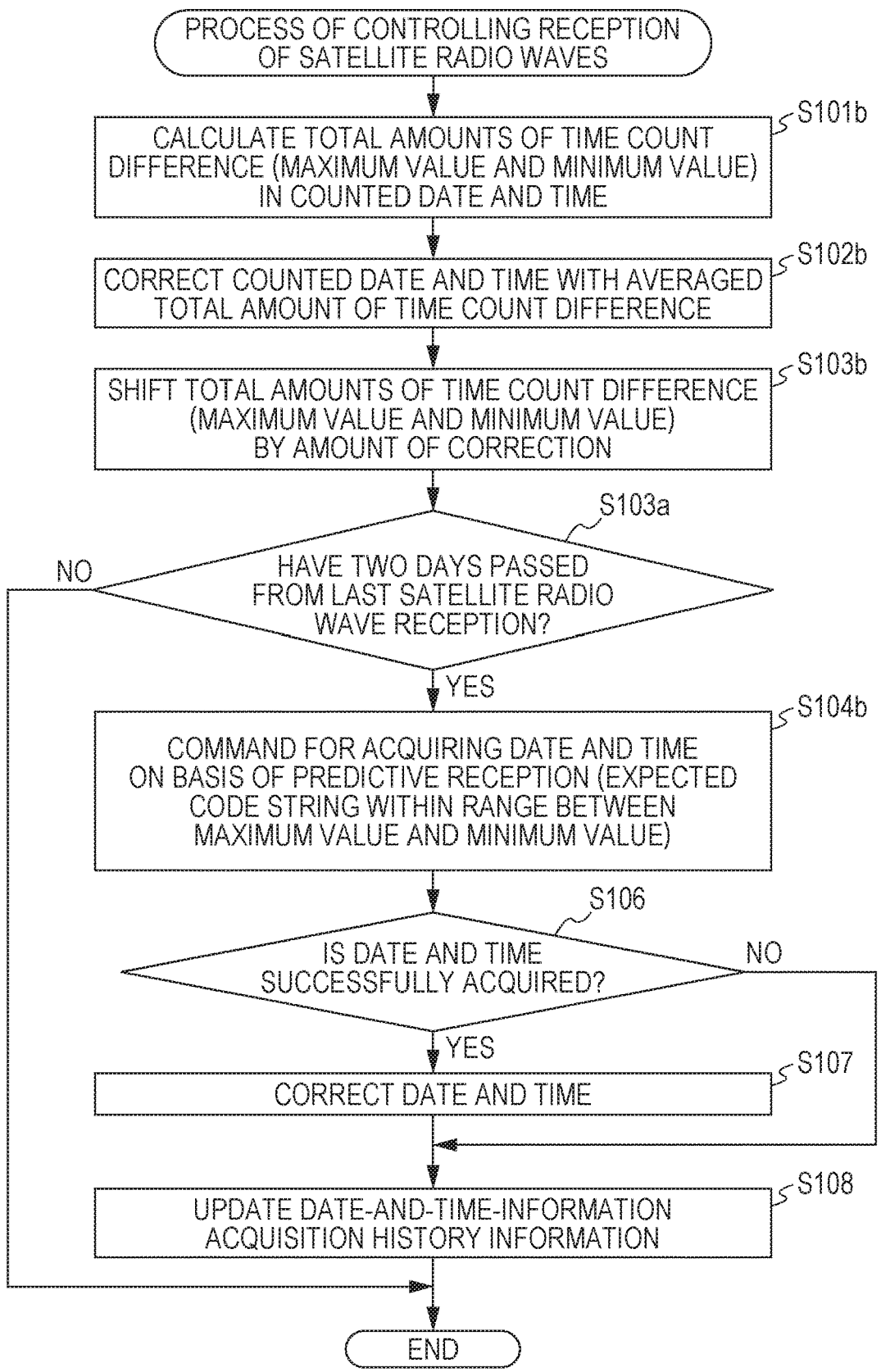
FIG. 7 is a flowchart illustrating a control procedure of a process of controlling reception of satellite radio waves, performed by an electronic clock according to a third embodiment.

FIG. 7 is a flowchart illustrating a control procedure of the CPU 41 for a process of controlling reception of satellite radio waves performed in the electronic clock 1 according to the third embodiment.

This process of controlling reception of satellite radio waves is the same as the process of controlling reception of satellite radio waves performed in the electronic clock 1*a* according to the second embodiment, excluding that steps S101*b* to S103*b* are performed instead of steps S101*a* and S102*a* and step S104 is replaced with step S104*b*, and the same contents of processing are denoted by the same reference signs and description thereof will be omitted.

As in the process of controlling reception of satellite radio waves performed in the electronic clock 1 according to the second embodiment, this process of controlling reception of satellite radio waves may be activated at a predetermined frequency, for example, once to several times a day, in addition to when receiving a command for acquiring date and time on the basis of satellite radio wave reception.

When the process of controlling reception of satellite radio waves is started, the CPU 41 calculates the maximum value and the minimum value of the total amount τ of time count difference described above (step S101*b*). The CPU 41 corrects date and time counted by the clock circuit 472 with an average value of the maximum value and the minimum value (i.e., intermediate value) (step S102*b*). The CPU 41 shifts the maximum value and the minimum value of the total amount τ of time count difference calculated by a value for correction (step S103*b*). Then, the CPU 41 proceeds to step S103*a*.

If "YES" in step S103*a*, the CPU 41 outputs a command for causing the satellite radio wave reception unit 50 to acquire date and time on the basis of predictive reception (step S104*b*). At this time, the CPU 41 outputs values of the maximum value and the minimum value of the total amount τ of time count difference, and specifies the satellite radio wave reception unit 50 to generate a predicted code string within a range between the maximum value and the minimum value. Furthermore, the CPU 41 may set the maximum number of positioning satellites to be tracked according to a range between the maximum value and the minimum value.

Note that the range between the maximum value and the minimum value can change depending on the error range ($\pm\Delta T$) of the temperature and the amount of time count difference at temperature T relative to the reference temperature T0. Unless a period of time in which the amount of time count difference at temperature T relative to the reference temperature T0 is large is not so long, the amount of time count difference is within the reference range in the process of controlling reception of satellite radio waves performed in the electronic clock 1 according to the first embodiment. When the amount of time count difference is outside the reference range, the command for acquiring date and time on the basis of normal reception may be output, as in the process of controlling reception of satellite radio waves in the electronic clock 1 according to the first embodiment.

Note that as described above, the electronic clock 1 which is fast in date and time counted is considered preferable compared to the electronic clock 1 which is slow in date and time counted. Thus, the correction value used in step S102b may be not an average value of the maximum value and the minimum value of the total amount of time count difference, but a maximum value of the total amount of time count difference. Alternatively, steps S102b and S103b may be omitted so that no correction is performed in the middle, and in step S103a, determination may be performed whether one day has passed from the last satellite radio wave reception, as in first embodiment, without determining whether two days have passed.

As described above, in the electronic clock 1 according to the third embodiment, the processor (the first processor 401 and the second processor 52) identifies current date and time within the margin of estimated error for estimation of the total amount $\tau$ of time count difference. Crystal oscillators widely used for electronic clocks may slightly vary in oscillating frequency or temperature dependency during manufacture. Thus, since the total amount $\tau$ of time count difference at current date and time is assumed within the variation range in consideration of the variation in a manufacturing process to generate a predicted code string in accordance with the total amount $\tau$ of time count difference or to determine performance or non-performance of the predictive-reception-based time acquisition, date and time can be accurately and efficiently acquired. Furthermore, in this case, the crystal oscillators require no fine examination, adjustment, or setting depending on variation before shipment, and time and labor can be reduced upon shipment.

Fourth Embodiment

Next, an electronic clock according to a fourth embodiment will be described.

The electronic clock according to the present embodiment has the same configurations as those of the electronic clock 1a according to the second embodiment, and the same configurations are denoted by the same reference signs and description thereof will be omitted.

Next, date-and-time correction operation in the electronic clock 1a according to the present embodiment will be described.

In the electronic clock 1a according to the present embodiment, satellite radio wave reception is not only merely performed at intervals of two or more days, but also not performed for at least two days (not less than a first interval) from date-and-time correction using a standard electric wave or the like. In a reception area where a standard electric wave is received, reception of the standard electric wave and correction of date and time are performed once a day at predetermined timing, and when date and time is successfully corrected, a result of temperature measurement stored in the temperature measurement history 432 (or unit amount D of time count difference) is erased, and the total amount $\tau$ of time count difference at the time of correction is set to "0".

Figure 8:
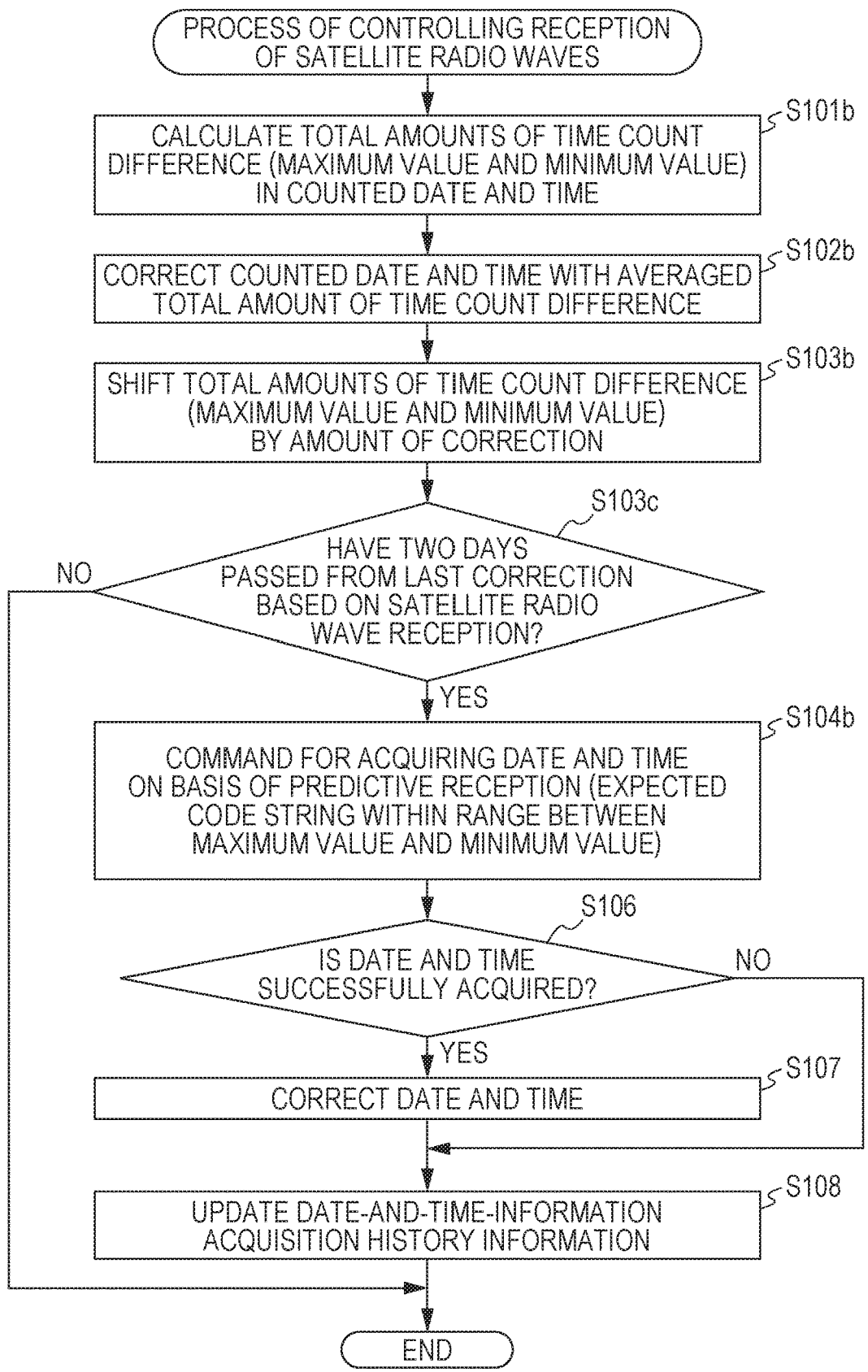
FIG. 8 is a flowchart illustrating a control procedure of a process of controlling reception of satellite radio waves performed by an electronic clock according to a fourth embodiment.

FIG. 8 is a flowchart illustrating a control procedure of the CPU 41 for a process of controlling reception of satellite radio waves performed in the electronic clock 1a according to the present embodiment.

The process of controlling reception of satellite radio waves is the same as the process of controlling reception of satellite radio waves in the electronic clock 1a according to the third embodiment (FIG. 7), excluding that step S103a is replaced with step S103c, and the contents of the same processing are denoted by the same reference signs and description thereof will be omitted.

After step S103b, the CPU 41 determines whether two days have passed from radio wave reception for the last date-and-time correction, that is, from satellite radio wave reception or standard electric wave reception (step S103c). When determining that two days have not passed ("NO" in step S103c), the CPU 41 finishes the process of controlling reception of satellite radio waves. When determining that two days have passed, the CPU 41 proceeds to step S104b.

As described above, the electronic clock 1a according to the fourth embodiment includes the receiver 63 that acquires current date-and-time information from outside, and when correcting date and time counted and held by the clock circuit 472 with the total amount $\tau$ of time count difference, the processor (the first processor 401 and the second processor 52) sets an interval from reception of current date-and-time information by the receiver 63 to subsequent radio wave reception by the receiver 51 to two or more days corresponding to an increased interval (two days) of acquisition of date and time on the basis of predictive reception.

That is, when date and time is acquired at an interval of not more than two days by the receiver 63, correction of date-and-time on the basis of reception of radio waves from a positioning satellite cannot be performed. Thus, without excessive satellite radio wave reception, fully accurate date and time can be maintained, and power consumption can be reduced. Furthermore, even if an interval for reception is increased from the last satellite radio wave reception, predictive-reception-based time acquisition is performed within a range in which reference date and time is appropriately maintained. Therefore, probability of failure in predictive-reception-based time acquisition can be fully reduced, and current date and time can be efficiently and accurately acquired.

Fifth Embodiment

Next, an electronic clock according to a fifth embodiment will be described.

Figure 9:
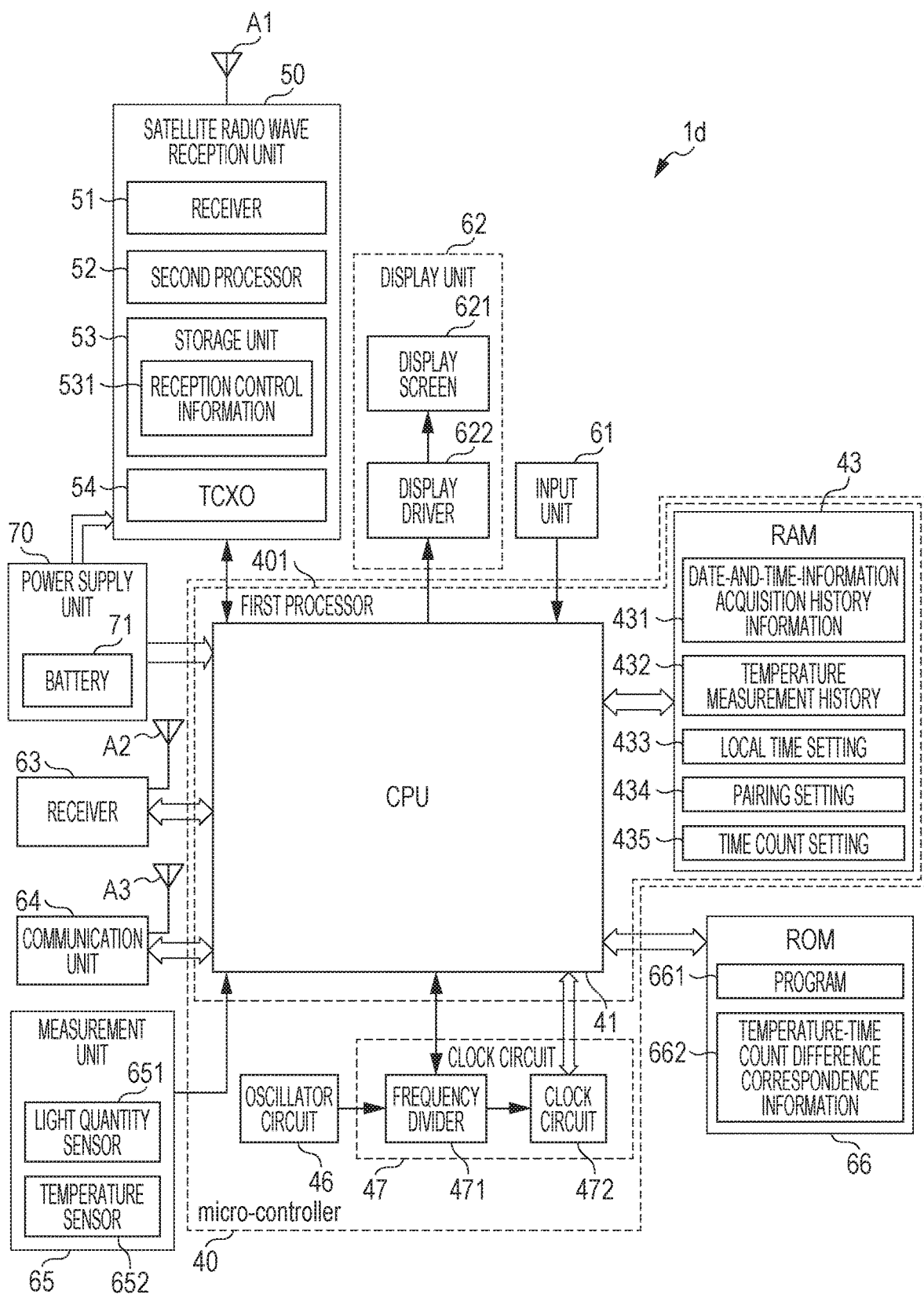
FIG. 9 is a block diagram illustrating a functional configuration of an electronic clock according to a fifth embodiment.

FIG. 9 is a block diagram illustrating a functional configuration of an electronic clock 1d according to the present embodiment.

The electronic clock 1d has the same configurations as those of the electronic clock 1 according to the first embodiment, excluding that a RAM 43 stores time count setting 435, and the same component elements are denoted by the same reference signs and description thereof will be omitted.

The time count setting 435 is information representing a set value for the number of counts per second of signals input from a frequency divider 471, and the time count setting 435 can be rewritten and updated.

Next, date-and-time correction operation in the electronic clock 1d according to the present embodiment will be described.

In the electronic clock 1d according to the present embodiment, the number of counts per second of signals input from a frequency divider 471 can be changed in a clock circuit 472. As described above, when a 32.768 kHz clock signal output from an oscillator circuit 46 is an accurate signal, 32,768 counts is one second. Here, the number of counts is increased or reduced by 1 at predetermined periodic intervals to correct (adjust) a frequency shift in a clock signal from the oscillator circuit 46, and date and time counted by the clock circuit 47 (clock circuit 472) is adjusted. For example, when the number of counts is increased or reduced by 1 at periodic intervals, the clock circuit 47 is changed and adjusted by 30.5176 ppm. Furthermore, for example, when the number of counts is increased or reduced by 1 every 16 periods, the clock circuit 47 is changed and adjusted by 1.9074 ppm. This adjustment corresponds to change and adjustment of the value of the reference unit amount D0 of time count difference in FIG. 2.

In the electronic clock 1d, during a predetermined period of time counted by the clock circuit 472, clock signals are caused to be input from a TCXO 54 of a satellite radio wave reception unit 50 to count the number of inputs. A clock signal from the TCXO 54 does not change depending on temperature, but a clock signal (speed of counting date and time) counted by the clock circuit 472 changes in accordance with the temperature of the oscillator circuit 46. Therefore, a change in the number of inputs from the TCXO 54 indicates how the clock signal used for count in the clock circuit 47 shifts relative to the accurate clock signal.

As described above, in particular, when a difference of temperature T relative to the reference temperature T0 is large and the unit amount D of time count difference is increased, the number of counts by the clock circuit 472 is increased or decreased to reduce the unit amount D of time count difference, and the increase of the total amount τ of time count difference is inhibited.

Figure 10:
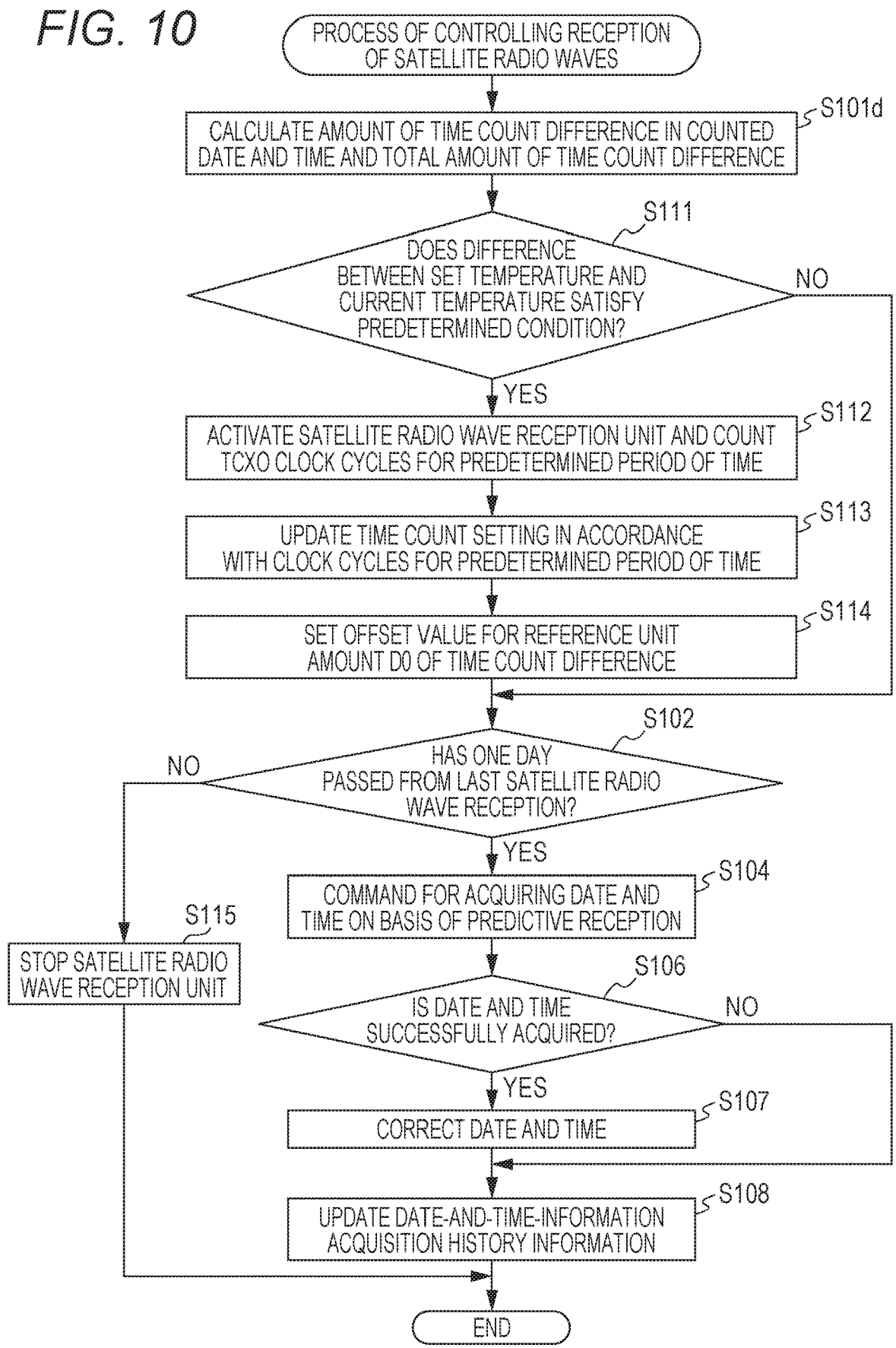
FIG. 10 is a flowchart illustrating a control procedure of a process of controlling reception of satellite radio waves performed in the electronic clock according to the fifth embodiment.

FIG. 10 is a flowchart illustrating a control procedure of the CPU 41 for a process of controlling reception of satellite radio waves performed in the electronic clock 1d according to the present embodiment.

Comparing with the process of controlling reception of satellite radio waves performed in the electronic clock 1 according to the first embodiment, in this process of controlling reception of satellite radio waves, step S101 is replaced with step S101d, steps S111 to S115 are added, and further, steps S103 and S105 are eliminated. The other is the same as the process of controlling reception of satellite radio waves performed in the electronic clock 1 according to the first embodiment, and the contents of the same processing are denoted by the same reference signs and description thereof will be omitted.

When a temperature measurement value is acquired, in addition to a command for acquiring date and time on the basis of radio wave reception from a positioning satellite is acquired as described above, here, the process of controlling reception of satellite radio waves is periodically activated once every 10 minutes.

When the process of controlling reception of satellite radio waves is started, the CPU 41 calculates an amount Δτ of time count difference in counted date and time, and further calculates a total amount τ of time count difference (step S101d). The CPU 41 determines whether a difference between a measured temperature and a set temperature as the reference of current time count setting 435 satisfies a predetermined condition (step S111). The predetermined condition includes, for example, mere generation of a difference not less than a reference value or continuation of such a state where a difference is generated for a predetermined period of time or longer. Furthermore, the condition may be different between a temperature T considerably deviated from the reference temperature T0 and a temperature T set deviated from the reference temperature T0 but returning to the vicinity of the reference temperature T0.

When determining that the predetermined condition is not satisfied ("NO" in step S111), the CPU 41 proceeds to step S102. When determining that the condition is satisfied ("YES" in step S111), the CPU 41 causes the satellite radio wave reception unit 50 to start, output a start signal and an end signal to the second processor 52 without operating the receiver 51, and count the clock signals from the TCXO 54 in the period (step S112).

The CPU 41 acquires the number of counts from the second processor 52 and updates the time count setting in accordance with the number of counts (step S113). At this time, the CPU 41 simultaneously causes the time count setting to store information about current measured temperature and the like. The CPU 41 sets an offset value of the reference unit amount D0 of time count difference (step S114). Then, the CPU 41 proceeds to step S102.

If "NO" in step S102, the CPU 41 stops the operation of the satellite radio wave reception unit 50 (step S115). Then, the CPU 41 finishes the process of controlling reception of satellite radio waves. If "YES" in step S102, the CPU 41 proceeds to step S104.

Note that on the basis of the counting time of the satellite radio wave reception unit 50, the CPU 41 may count oscillation signals from the oscillator circuit 46. In this configuration, the CPU 41 outputs a command for causing the satellite radio wave reception unit 50 to perform counting for 16 seconds, and causes the satellite radio wave reception unit 50 to output a start signal and an end signal to the CPU 41 at the start and end of the 16 seconds. The CPU 41 counts the number of inputs of oscillation signals from the oscillator circuit 46 after acquiring the start signal and before acquiring the end signal.

As described above, in the electronic clock 1d according to the fifth embodiment, the processor (the first processor 401 and the second processor 52) compares a clock signal output from the oscillator circuit 46 and a clock signal from the TCXO 54 relating to the operation of the receiver 51, detects a frequency shift of a clock signal output from the oscillator circuit 46, and adjusts the frequency shift.

As described above, the clock signal from the TCXO 54 having excellent accuracy and the clock signal from the oscillator circuit 46 are compared if necessary to adjust the number of counts of clock signals from the oscillator circuit 46, and the accuracy of counting date and time by the clock circuit 47 can be improved. Thus, a range in which a predicted code string is generated, performance or non-performance of predictive-reception-based time acquisition, or the like when acquiring date and time by receiving satellite radio waves can be appropriately determined, and date and time can be acquired more accurately and efficiently. Furthermore, such adjustment can be appropriately performed to reduce a difference in counted date and time, reducing the frequency of satellite radio wave reception. Thus, power consumption can be reduced.

Sixth Embodiment

Next, an electronic clock according to a sixth embodiment will be described.

In the electronic clock 1e according to the present embodiment, an oscillation signal from an oscillator circuit 46 is divided if necessary to be output as a time count signal to a clock circuit 472 in a frequency divider 471, and at that time, the number of decimations for decimating signals relating to theoretical regulation can be changed in accordance with a control signal from a CPU 41.

Figure 11:
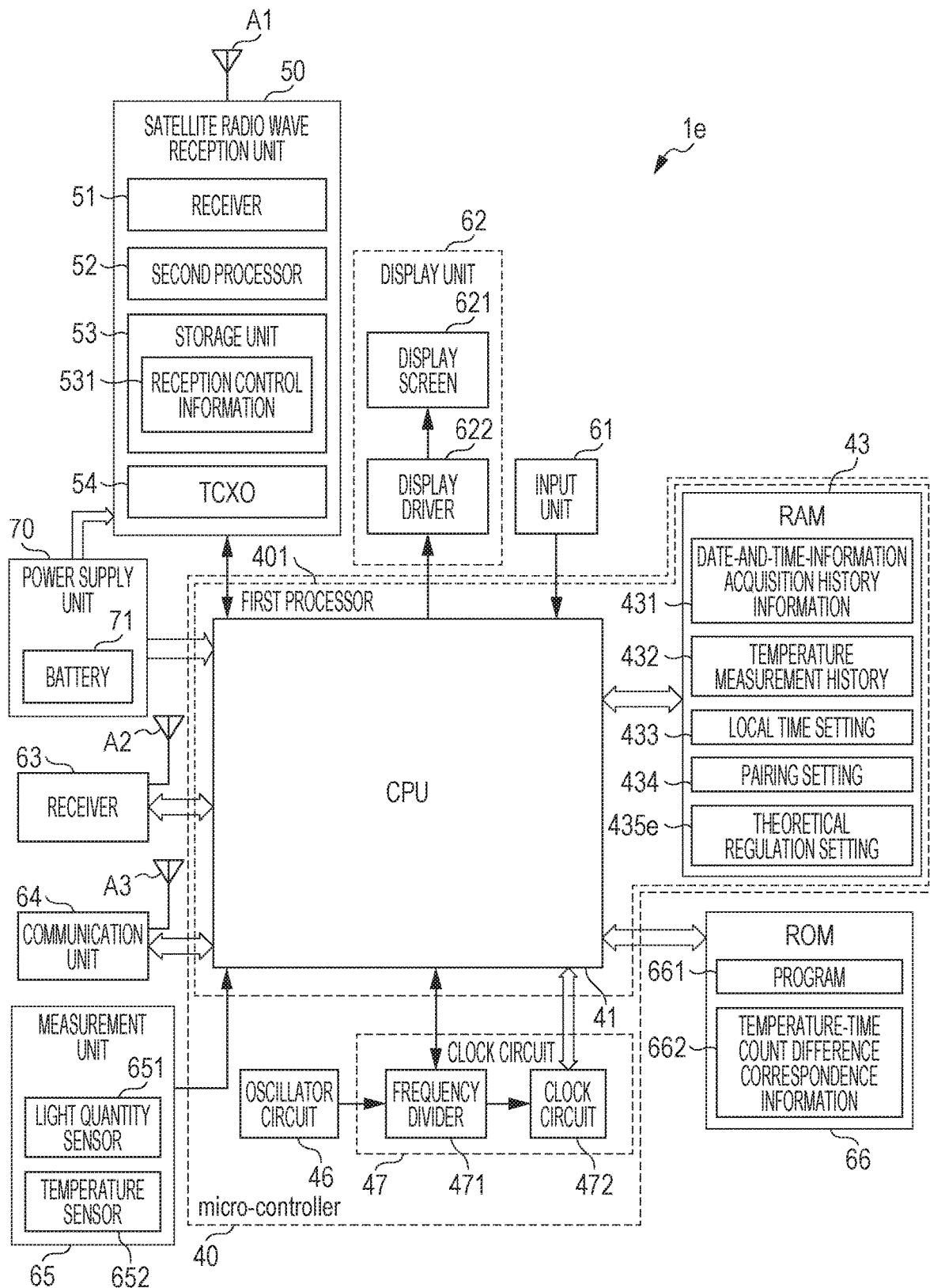
FIG. 11 is a block diagram illustrating a functional configuration of an electronic clock according to a sixth embodiment.

FIG. 11 is a block diagram illustrating a functional configuration of the electronic clock 1e according to the present embodiment.

In this electronic clock 1e, instead of the time count setting 435 in the functional configuration of the electronic clock 1d according to the fifth embodiment, a theoretical regulation setting 435e enabling setting and update is stored in a RAM 43. The other configuration is the same as that of the electronic clock 1d according to the fifth embodiment, and the same component elements are denoted by the same reference signs and description thereof will be omitted.

Figure 12:
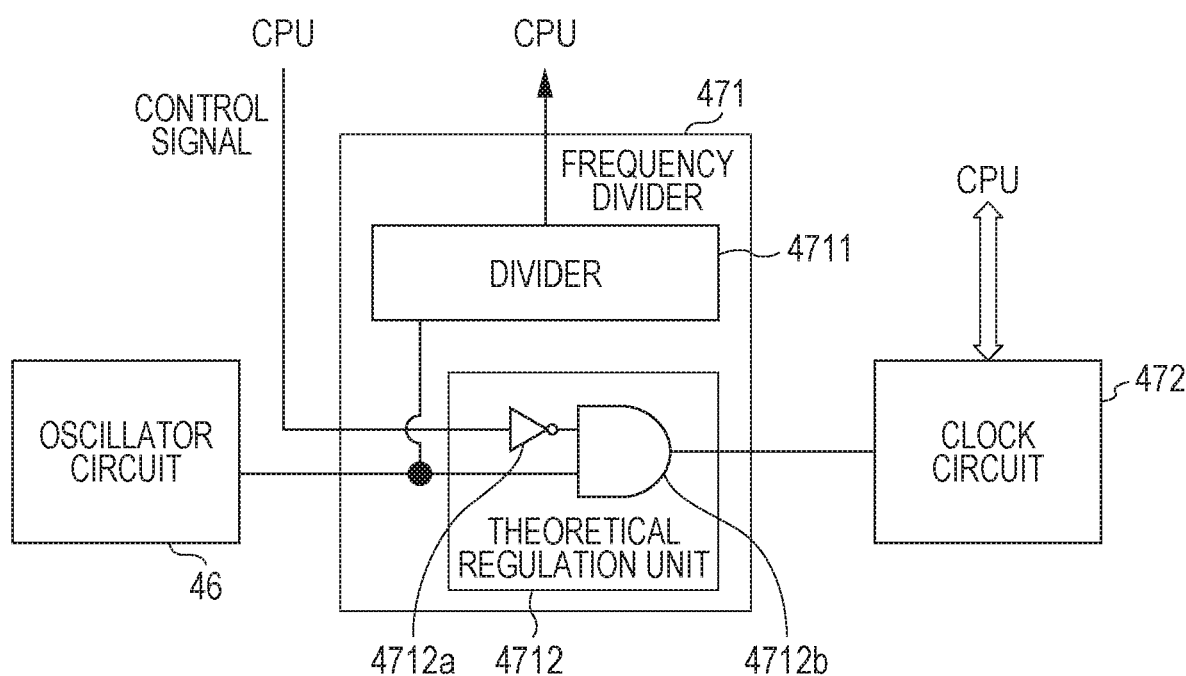
FIG. 12 is a diagram illustrating a configuration for outputting a clock signal from an oscillator circuit.

FIG. 12 is a diagram illustrating a configuration for outputting a clock signal from the oscillator circuit 46.

A clock signal of oscillating frequency (32.768 kHz) output from the oscillator circuit 46 is a square wave including a high-level signal and a low-level signal and output every clock cycle. The clock signal input to the frequency divider 471 is divided into two paths. One signal is input to the divider 4711, divided into signals having a set frequency, output to the CPU 41, and used for normal purposes. The other signal is input to a theoretical regulation unit 4712, and input to an AND circuit 4712b together with a control signal input via an inverter 4712a.

The control signal is normally a low-level signal, converted into a high-level signal by the inverter 4712a, and input to the AND circuit 4712b. Thus, in this case, the clock signal input to the AND circuit 4712b is output directly. The CPU 41 switches the control signal to a high level in each predetermined step to cause a low-level signal to be input to the AND circuit 4712b via the inverter 4712a. In this way, a high level portion of the clock signal input from the oscillator circuit 46 is appropriately converted to a low level by the theoretical regulation unit 4712, decimating the output of the high-level signal. The frequency of outputting a control signal of high level from the CPU 41 is defined so that the number of high-level signals (the number of rises to the high level) counted by the clock circuit 472 every predetermined period of time (e.g., 16 seconds or 64 seconds) is made most accurate. Output timing of the control signal of high level does not need to be equal in the predetermined period of time, and is appropriately set. Information about the output frequency and timing is stored, as the theoretical regulation setting 435e, in the RAM 43.

The set numbers are defined so that the reference unit amount D0 of time count difference described above has an appropriate value. In the electronic clock 1e according to the present embodiment, the set numbers can be changed. That is, in the electronic clock 1d according to the fifth embodiment, the number of counts of clock signals is changed every second, but in the electronic clock 1e according to the present embodiment, an output time (counting time) of the clock signals counted by a fixed number is changed by changing the number of decimations without changing a normal frequency. Note that a process of determining decimation timing when adjusting the number of decimations may be sequentially listed beforehand.

Figure 13:
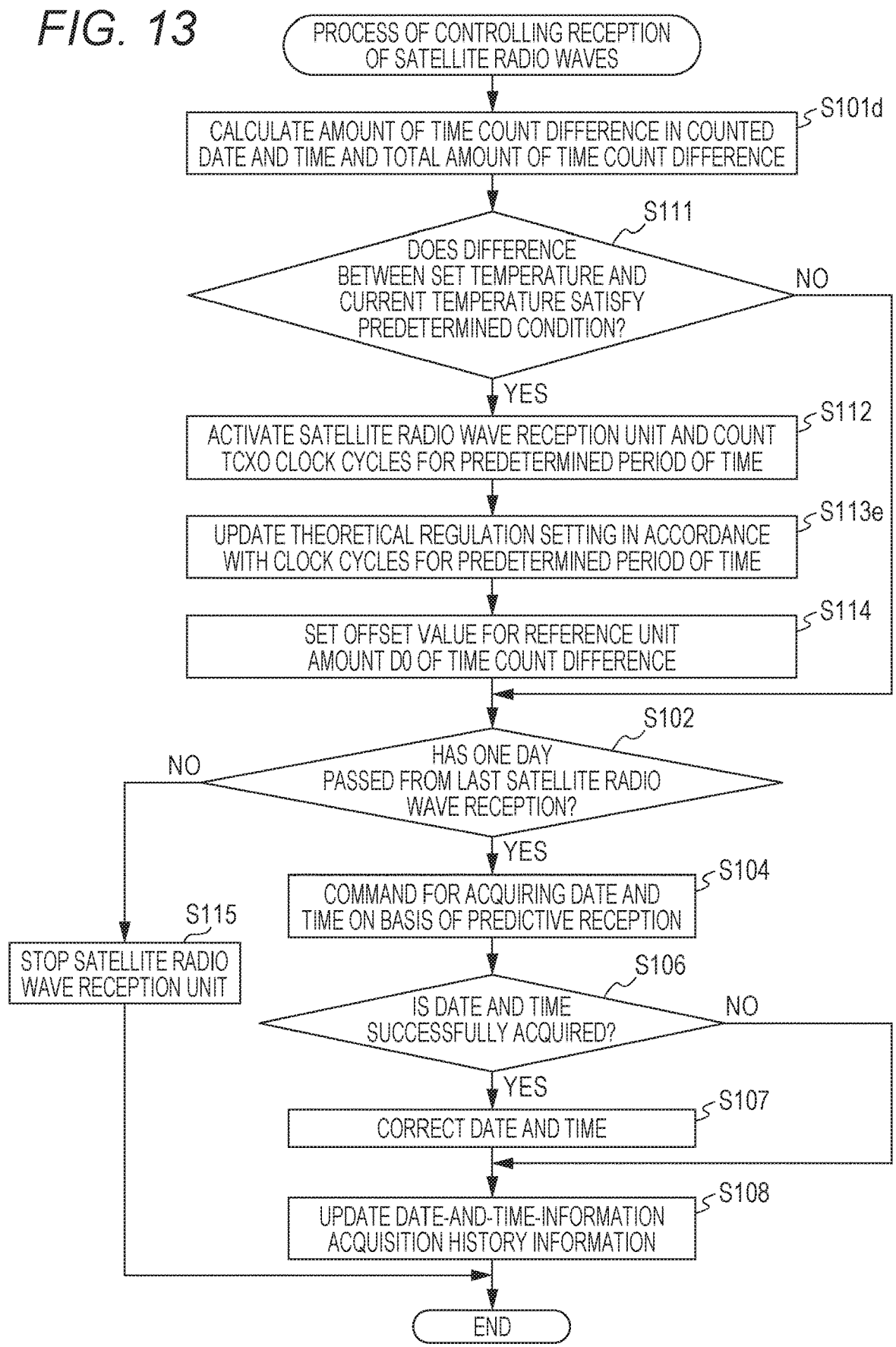
FIG. 13 is a flowchart illustrating a control procedure of a process of controlling reception of satellite radio waves performed in the electronic clock according to the sixth embodiment.

FIG. 13 is a flowchart illustrating a control procedure of the CPU 41 for a process of controlling reception of satellite radio waves performed in the electronic clock 1e according to the present embodiment. This process of controlling reception of satellite radio waves is the same as the process of controlling reception of satellite radio waves performed in the electronic clock 1d according to the fifth embodiment, excluding that step S113 is changed to step S113e, and the contents of the same processing are denoted by the same reference signs and description thereof will be omitted.

In step S112, when acquiring the number of counts of clock signals from the TCXO in a predetermined period of time, the CPU 41 changes and sets the theoretical regulation setting 435e in accordance with the number of counts to change the number or timing of decimations (step S113e). Then, the CPU 41 proceeds to step S114.

As described above, in the electronic clock 1e according to the sixth embodiment, the theoretical regulation setting 435e can be changed to improve the accuracy of counting date and time, as in the electronic clock 1d according to the fifth embodiment, and a range in which a predicted code string is generated, performance or non-performance of predictive-reception-based time acquisition, or the like when acquiring receiving satellite radio waves can be appropriately determined. Thus, acquisition of date and time by receiving satellite radio waves can be performed more accurately and efficiently.

Note that the present invention is not limited to the embodiments described above, and various changes or alterations may be made.

For example, in the embodiments described above, for the oscillator of the oscillator circuit 46, a crystal oscillator having a frequency reducing depending on the square of an amount of time count difference from the reference temperature T0, but the oscillator is not limited to this description. The present invention can be applied to general oscillators having an oscillating frequency showing temperature dependency.

Furthermore, in the embodiments described above, temperature measurement is periodically performed once every 10 minutes, but measurement interval may be changed depending on temperature change.

Furthermore, in the embodiments described above, the total amount τ of time count difference is obtained by merely adding the amounts Δτ of time count difference, but when the latest date-and-time correction has low accuracy and there is an initial amount τ0 of time count difference, the amounts Δτ of time count difference can be added successively to this initial amount τ0 of time count difference to determine the total amount τ of time count difference. Furthermore, when this initial amount τ0 of time count difference has a range as in the error range according to the third embodiment, this range may be taken into consideration.

Furthermore, in the embodiments described above, the temperature measurement history 432 stores individual temperature values measured or amounts Δτ of time count difference obtained by conversion, but may always determine a total amount τ of time count difference and store only the determined total amount τ of time count difference.

Furthermore, in the embodiments described above, methods of calculating an amount Δτ of time count difference for temperature linearly changing at temperature measurement intervals and for temperature being constant has been described, but the amount Δτ of time count difference may be calculated by formula: Δτ=(D(T(t1))+D(T(t2)))/2×Δt, in consideration of the unit amount D of time count difference linearly changing at temperature measurement intervals.

Furthermore, in the embodiments described above, an example of reception of radio waves from a GPS satellite has been described, but when a predicted code string is generated similarly, the present invention may be also applied to acquisition of date and time by receiving radio waves from another positioning system, such as GLONASS. Furthermore, the present invention may be applied to acquisition of date and time by combining part of date-and-time information with date and time counted by the clock circuit 47.

Furthermore, in the embodiments described above, the predictive-reception-based time acquisition is distinguished the normal reception-based time acquisition, depending on the total amount τ of time count difference, but to efficiently perform the partial-reception-based time acquisition of the normal reception-based time acquisition, the total amount τ of time count difference is required. Therefore, the total amount τ of time count difference obtained on the basis of the temperature measurement history 432 may be used to determine whether partial-reception-based time acquisition is performed, and otherwise, the total amount τ of time count difference is considered to acquire date and time.

Furthermore, in the third embodiment, the values of the error ranges of the reference temperature T0 and the reference unit amount D0 of time count difference for the oscillator circuit 46 are held in the temperature-time count difference correspondence information 662, but may be incorporated into the program 661 beforehand.

Furthermore, in the second and third embodiments, date and time counted by the clock circuit 47 (clock circuit 472) is corrected on the basis of the total amount τ of time count difference to increase the interval for acquiring date and time by receiving satellite radio waves to one or more times every two days, but the interval is not necessarily increased. Furthermore, time of acquiring date and time by receiving satellite radio waves may be determined depending on the total amount τ of time count difference or the error range according to the third embodiment without restricting a minimum interval to one day or two days. Furthermore, for a reception request input by the user, a minimum interval for acquiring date and time by receiving satellite radio waves may not be changed or defined depending on the power capacity of a power supply or the like.

Furthermore, in the fourth embodiment, the receiver 63 is described as a date-and-time information radio receiver for acquiring accurate current date-and-time information. However, for another acquisition method, for example, acquisition of current date and time via the communication unit 64 using Bluetooth, when acquired present date-and-time information has sufficient accuracy and the accuracy can be confirmed by information relating to accuracy in current date and time, as described above, the acquired present date-and-time information is contained in the date-and-time information radio receiver. Thus, an interval for reception by the receiver 51 can be reduced to two days or the like.

Furthermore, in the fifth and sixth embodiments, comparison is performed every time between the TCXO 54 and the oscillator circuit 46, but a comparison result may be held corresponding to measured temperature so that adjustment can be performed using the comparison result without additional comparison at the same temperature as the held temperature.

Furthermore, in the above description, as a computer-readable medium which stores the program 661 for controlling satellite radio wave reception according to the present invention upon acquiring current date-and-time information, the non-volatile memory such as a flash memory and the ROM 66 including a mask ROM are exemplified, but the computer-readable medium is not limited thereto. As another computer-readable medium, a portable recording medium, such as a hard disk drive (HDD), a CD-ROM, or a DVD disk can be applied. Furthermore, as a medium for providing data of the program according to the present invention via a communication line, a carrier wave is also applied to the present invention.

Furthermore, the configurations, control contents, and procedures described in the respective embodiments may be used by being appropriately combined without inconsistency or cancellation of effects.

In addition, the configurations and specific details, such as the control procedures or display examples, described in the above embodiments may be changed or altered without departing from the scope and spirits of the present invention.

Some embodiments of the present invention have been described, but the scope of the present invention is not limited to the embodiments described above, and is covered within the spirit and scope of the invention as claimed in the claims and their equivalents.

The invention claimed is:

1. An electronic device comprising:
   an oscillator that outputs a clock signal of predetermined frequency;
   a clock circuit that counts a date and time in accordance with input of the clock signal;
   a temperature sensor that measures a temperature relating to a change of the predetermined frequency;
   a positioning satellite radio receiver that receives a radio wave from a positioning satellite; and
   a processor,
   wherein the processor:
      estimates an amount of a time count difference in the date and time counted by the clock circuit based on a history of temperatures measured by the temperature sensor, and
      combines the date and time counted by the clock circuit, the estimated amount of the time count difference, and part of date-and-time information obtained from a radio wave received by the positioning satellite radio receiver to identify a current date and time, and
   wherein, in identifying the current date and time, the processor performs predictive-reception-based time acquisition in which the processor generates a predicted code string expected to be received by the positioning satellite radio receiver, based on the date and time counted by the clock circuit and the estimated amount of the time count difference, and then identifies the current date and time based on a matching detection timing between the predicted code string and a received code string received by the positioning satellite radio receiver.

2. The electronic device according to claim 1, wherein the processor corrects the date and time counted by the clock circuit based on the estimated amount of the time count difference, and generates the predicted code string depending on the corrected date and time.

3. The electronic device according to claim 2, wherein the processor identifies the current date and time within a margin of estimated error for estimation of the amount of the time count difference.

4. The electronic device according to claim 2, wherein when the amount of the time count difference is outside a predetermined reference range, the processor decodes the received code string to acquire the current date and time.

5. The electronic clock according to claim 2, wherein the processor compares the clock signal output from the oscillator and a clock signal from a reception operation oscillator relating to operation of the positioning satellite radio receiver, detects a frequency shift of the clock signal output from the oscillator, and adjusts the frequency shift.

6. The electronic device according to claim 2, wherein when correcting the date and time counted by the clock circuit based on the estimated amount of the time count difference, the processor sets a frequency of radio wave reception by the positioning satellite radio receiver to not more than a predetermined first frequency.

7. The electronic device according to claim 6, wherein the processor sets the frequency of radio wave reception by the positioning satellite radio receiver to not more than a predetermined second frequency, the first frequency being less than the second frequency.

8. The electronic device according to claim 6, further comprising:
a date-and-time information radio receiver that receives a radio wave containing current date-and-time information from outside,
wherein the processor sets an interval from reception of current date-and-time information by the date-and-time information radio receiver to subsequent radio wave reception by the positioning satellite radio receiver to not less than a first interval corresponding to the first frequency.

9. The electronic device according to claim 7, further comprising:
a date-and-time information radio receiver that receives a radio wave containing current date-and-time information from outside,
wherein the processor sets an interval from reception of current date-and-time information by the date-and-time information radio receiver to subsequent radio wave reception by the positioning satellite radio receiver to not less than a first interval corresponding to the first frequency.

10. The electronic device according to claim 1, wherein the processor identifies the current date and time within a margin of estimated error for estimation of the amount of the time count difference.

11. The electronic device according to claim 10, wherein when the amount of the time count difference is outside a predetermined reference range, the processor decodes the received code string to acquire the current date and time.

12. The electronic clock according to claim 10, wherein the processor compares the clock signal output from the oscillator and a clock signal from a reception operation oscillator relating to operation of the positioning satellite radio receiver, detects a frequency shift of the clock signal output from the oscillator, and adjusts the frequency shift.

13. The electronic device according to claim 1, wherein the processor compares the clock signal output from the oscillator and a clock signal from a reception operation oscillator relating to operation of the positioning satellite radio receiver, detects a frequency shift of the clock signal output from the oscillator, and adjusts the frequency shift.

14. An electronic device comprising:
an oscillator that outputs a clock signal of predetermined frequency;
a clock circuit that counts a date and time in accordance with input of the clock signal;
a temperature sensor that measures a temperature relating to a change of the predetermined frequency;
a positioning satellite radio receiver that receives a radio wave from a positioning satellite; and
a processor,
wherein the processor:
estimates an amount of a time count difference in the date and time counted by the clock circuit based on a history of temperatures measured by the temperature sensor, and
combines the date and time counted by the clock circuit, the estimated amount of the time count difference, and part of date-and-time information obtained from a radio wave received by the positioning satellite radio receiver to identify a current date and time, and
wherein when the amount of the time count difference is outside a predetermined reference range, the processor decodes a received code string to acquire the current date and time.

15. A date-and-time acquisition control method for an electronic device including an oscillator that outputs a clock signal of predetermined frequency, a clock circuit that counts a date and time in accordance with input of the clock signal, a temperature sensor that measures a temperature relating to a change of the predetermined frequency, and a positioning satellite radio receiver that receives a radio wave from a positioning satellite, the method comprising:
estimating an amount of a time count difference in the date and time counted by the clock circuit based on a history of temperatures measured by the temperature sensor; and
combining the date and time counted by the clock circuit, the estimated amount of the time count difference, and part of date-and-time information obtained from a radio wave received by the positioning satellite radio receiver to identify a current date and time,
wherein the identifying the current date and time comprises performing predictive-reception-based time acquisition by generating a predicted code string expected to be received by the positioning satellite radio receiver, based on the date and time counted by the clock circuit and the estimated amount of the time count difference, and then identifying the current date and time based on a matching detection timing between the predicted code string and a received code string received by the positioning satellite radio receiver.

16. A date-and-time acquisition control method for an electronic device including an oscillator that outputs a clock signal of predetermined frequency, a clock circuit that counts a date and time in accordance with input of the clock signal, a temperature sensor that measures a temperature relating to a change of the predetermined frequency, and a positioning satellite radio receiver that receives a radio wave from a positioning satellite, the method comprising:
estimating an amount of a time count difference in the date and time counted by the clock circuit based on a history of temperatures measured by the temperature sensor; and
combining the date and time counted by the clock circuit, the estimated amount of the time count difference, and part of date-and-time information obtained from a radio wave received by the positioning satellite radio receiver to identify a current date and time, wherein the method further comprises, when the amount of the time count difference is outside a predetermined reference range, decoding a received code string to acquire the current date and time.

17. A date-and-time acquisition control method for an electronic device including an oscillator that outputs a clock signal of predetermined frequency, a clock circuit that counts a date and time in accordance with input of the clock signal, a temperature sensor that measures a temperature relating to a change of the predetermined frequency, and a positioning satellite radio receiver that receives a radio wave from a positioning satellite, the method comprising:

estimating an amount of a time count difference in the date and time counted by the clock circuit based on a history of temperatures measured by the temperature sensor; and combining the date and time counted by the clock circuit, the estimated amount of the time count difference, and part of date-and-time information obtained from a radio wave received by the positioning satellite radio receiver to identify a current date and time, wherein the current date and time is identified within a margin of estimated error for estimation of the amount of the time count difference, and wherein the method further comprises comparing the clock signal output from the oscillator and a clock signal from a reception operation oscillator relating to operation of the positioning satellite radio receiver, detecting a frequency shift of the clock signal output from the oscillator, and adjusting the frequency shift.

* * * * *

UNITED STATES PATENT AND TRADEMARK OFFICE
CERTIFICATE OF CORRECTION

PATENT NO. : 10,663,598 B2
APPLICATION NO. : 15/988580
DATED : May 26, 2020
INVENTOR(S) : Takeshi Matsue and Tatsuya Sekitsuka It is certified that error appears in the above-identified patent and that said Letters Patent is hereby corrected as shown below:

In the Claims

Column 27, Line 9, Claim 5, Line 1, delete "electronic clock" and insert -- electronic device --.

Column 27, Line 56, Claim 12, Line 1, delete "electronic clock" and insert -- electronic device --.

Signed and Sealed this
Fifteenth Day of September, 2020

Andrei Iancu
*Director of the United States Patent and Trademark Office*